(12) United States Patent
Kobayashi et al.

(10) Patent No.: US 8,588,006 B2
(45) Date of Patent: Nov. 19, 2013

(54) SEMICONDUCTOR MEMORY INCLUDING SWITCHING CIRCUIT FOR SELECTING DATA SUPPLY

(75) Inventors: Hiroyuki Kobayashi, Tokyo (JP); Toshiya Uchida, Tokyo (JP)

(73) Assignee: Fujitsu Semiconductor Limited, Yokohama (JP)

( * ) Notice: Subject to any disclaimer, the term of this patent is extended or adjusted under 35 U.S.C. 154(b) by 0 days.

(21) Appl. No.: 13/570,158

(22) Filed: Aug. 8, 2012

(65) Prior Publication Data

US 2012/0300559 A1 Nov. 29, 2012

Related U.S. Application Data

(62) Division of application No. 12/624,764, filed on Nov. 24, 2009, now Pat. No. 8,264,881.

(30) Foreign Application Priority Data

Nov. 27, 2008 (JP) .................... 2008-302645

(51) Int. Cl.
 *G11C 7/10* (2006.01)
(52) U.S. Cl.
 USPC .................. 365/189.05; 365/230.06
(58) Field of Classification Search
 USPC ........................ 365/189.05, 230.06
 See application file for complete search history.

(56) References Cited

U.S. PATENT DOCUMENTS

| 5,689,462 | A | 11/1997 | Proebsting |
| 7,505,351 | B2 | 3/2009 | Kwon |
| 2002/0054525 | A1* | 5/2002 | Eto et al. ............... 365/201 |
| 2003/0043653 | A1 | 3/2003 | Kuroda et al. |
| 2005/0270859 | A1 | 12/2005 | Kato |
| 2010/0040122 | A1 | 2/2010 | Barbier et al. |

FOREIGN PATENT DOCUMENTS

| JP | 63-140551 A | 6/1988 |
| JP | 9-293375 A | 11/1997 |
| JP | 11-213697 A | 8/1999 |
| JP | 11-283372 A | 10/1999 |
| JP | 2001-274670 A | 10/2001 |
| JP | 2003-77272 A | 8/2003 |
| JP | 2007-280596 A | 10/2007 |

OTHER PUBLICATIONS

Notice of Reasons for Refusal dated Oct. 30, 2012, from corresponding Japanese Application No. 2008-302645 with partial translation.

* cited by examiner

*Primary Examiner* — Hoai V Ho
(74) *Attorney, Agent, or Firm* — Arent Fox LLP

(57) ABSTRACT

A semiconductor memory is provided which includes: a first pad; a second pad disposed adjacent to the first pad; a first output buffer coupled to the first pad; and a second output buffer coupled to the second pad. The first pad is coupled to the second pad by metal.

7 Claims, 25 Drawing Sheets

FIG. 10

| FIGURE | DQ | X32Z | CADa | BUF1 | BUF2 | BUF3 | BUF4 | BUSE | BUS0 |
|---|---|---|---|---|---|---|---|---|---|
| FIGURE 1 | DQ0-31 (NBM) | H | L | × | × | ○ | ○ | DTE | DTE |
| | | H | H | ○ | ○ | × | × | DTO | DTO |
| FIGURE 2 | DQ0-63 (WBM) | L | L | ○ | × | ○ | × | DTE | DTO |
| | | L | H | ○ | × | ○ | × | DTE | DTO |

FIG. 15

| FIGURE | DQ | X32Z | CADa | SW1 | SW2 | SW3 | SW4 | BUSE | BUSO |
|---|---|---|---|---|---|---|---|---|---|
| FIGURE 12 | DQ0-31 (NBM) | H | L | × | ○ | ○ | × | DTE | DTE |
|  |  | H | H | ○ | × | × | ○ | DTO | DTO |
| FIGURE 13 | DQ0-63 (WBM) | L | L | × | ○ | × | ○ | DTE | DTO |
|  |  | L | H | × | ○ | × | ○ | DTE | DTO |

FIG. 20

| DQ | X32Z | DS1 | DS2 | DS3 | DS4 | DRV |
|---|---|---|---|---|---|---|
| DQ0-31 (NBM) | H | H | H | H | H | 4 |
| | | H | H | H | L | 3 |
| | | H | H | L | L | 2 |
| | | H | L | L | L | 1 |
| DQ0-63 (WBM) | L | H | H | H | H | 2 |
| | | H | L | H | L | 1 |

FIG. 22

| DQ | X32Z | DS1 | DS2 | DS3 | DRV |
|---|---|---|---|---|---|
| DQ0–31 (NBM) | H | H | H | H | 3 |
|  | H | H | H | L | 2 |
|  | H | H | L | L | 1 |
| DQ0–63 (WBM) | L | H | L | H | 1 |

US 8,588,006 B2

SEMICONDUCTOR MEMORY INCLUDING SWITCHING CIRCUIT FOR SELECTING DATA SUPPLY

CROSS-REFERENCE TO RELATED APPLICATION

This application is a divisional of pending U.S. patent application Ser. No. 12/624,764, filed Nov. 24, 2009, which claims the benefit of priority from the prior Japanese Patent Application No. 2008-302645, filed Nov. 27, 2008, the entire contents of which are incorporated herein by reference.

BACKGROUND

1. Field

Embodiments discussed herein relate to a semiconductor memory.

2. Description of Related Art

Japanese Laid-open Patent Publication Nos. H11-213697, No. 2007-280596, No. H11-283372, No. 2001-274670, and the like, disclose a semiconductor memory capable of switching a bit width of data.

SUMMARY

According to one aspect of the embodiments, a semiconductor memory is provided Which includes: a first pad; a second pad disposed adjacent to the first pad; a first output buffer coupled to the first pad; and a second output buffer coupled to the second pad. The first pad is coupled to the second pad by metal.

Additional advantages and novel features of the invention will be set forth in part in the description that follows, and in part will become more apparent to those skilled in the art upon examination of the following or upon learning by practice of the invention.

BRIEF DESCRIPTION OF THE DRAWINGS

FIG. 10 illustrates an exemplary operation of a bus switch circuit;
FIG. 15 illustrates an exemplary operation of a bus switch circuit;
FIG. 20 illustrates an exemplary operation of data input/output, buffers;
FIG. 22 illustrates an exemplary operation of data input/output, buffers.

DESCRIPTION OF EMBODIMENTS

In the Figures, signal lines illustrated in bold indicate that a plurality of signal lines are provided. A portion of a block to which the bold line is coupled includes a plurality of circuits. Signal lines are labeled with reference symbols representing names of signals transmitted through the signal lines. A signal having a reference symbol suffixed with a letter "Z" indicates a positive logic. A signal having a reference symbol prefixed with a symbol "/" indicates a negative logic. A double-square symbol represents an external terminal such as a pad on a semiconductor chip or a lead of a package containing the semiconductor chip therein. Terminals and signals supplied through the terminals, respectively, are denoted by like reference symbols.

Figure 1:
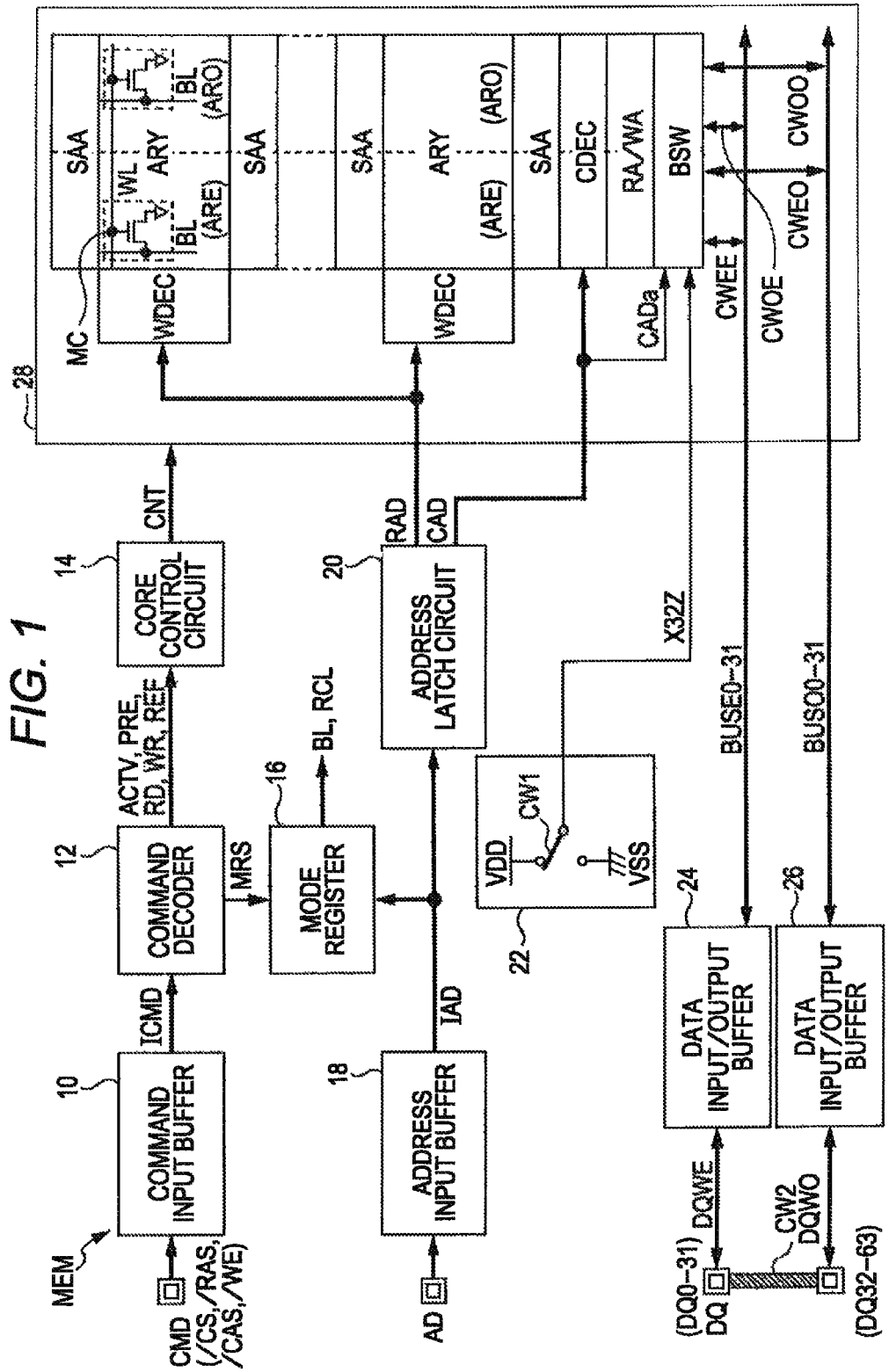
FIG. 1 illustrates a first embodiment.

FIG. 1 illustrates a first embodiment. A semiconductor memory MEM illustrated in FIG. 1 may be, for example, a DRAM. The semiconductor memory MEM may be operated in synchronization with a clock or may be operated without clock synchronization. The semiconductor memory MEM may be a semiconductor memory device capsulated in a package or may be a memory macro (IP) mounted on a system LSI and the like.

The semiconductor memory MEM includes a command input buffer 10, a command decoder 12, a core control circuit 14, a mode register 16, an address input buffer 18, an address latch circuit 20, a bit width switch circuit 22, a data input/output buffers 24 and 26, and a memory core 28.

The command input buffer 10 receives a command signal CMD and outputs the received command signal CMD as an internal command signal ICMD. The command signal CMD includes, for example, a chip selection signal /CS, a row address strobe signal /RAS, a column address strobe signal /CAS, or a write enable signal /WE.

The command decoder 12 decodes the command signal ICMD and outputs an active command signal ACTV, a precharge command signal PRE, a read command signal RD, a write command signal WR, a refresh command signal REF, or a mode register setting command signal MRS. The active command ACTV is output when memory cell arrays ARY are set to an active state. The precharge command signal PRE is output when a bit line BL of the memory cell arrays ARY is precharged. The read command signal ED is output when data stored in the memory cell arrays ARY is read. The write command signal WR is output when data is written to the memory cell arrays ARY. The refresh command signal REF is output when memory cells MC are refreshed. The mode register setting command signal MRS is output when the mode register 16 is set to a given state. The symbol BL also includes a name of a burst length.

The core control circuit 14 outputs a control signal CNT for controlling an operation of the memory core 28 in response to the command signal ACTV, PRE, RD, WR, or REF. The control signal CNT includes a precharge control signal, a word control signal, a sense amplifier control signal, a column control signal, a read amplifier control signal, a write amplifier control signal, or the like. The precharge control signal is generated when the bit line BL is precharged. The word control signal is generated when a word line WL is activated.

The sense amplifier control signal is generated when a sense amplifier is activated. The column control signal is generated when a column switch CSW is turned on. The read amplifier control signal is generated when a read amplifier RA is activated. The write amplifier control signal is generated when a write amplifier WA is activated.

The mode register 16 includes a plurality of registers set in response to an address signal IAD (AD) received together with the mode register setting command signal MRS. The mode register 16 may be set in response to a data signal DQ received together with the mode register setting command signal MRS. The mode register 16 outputs the burst length signal BL and a read latency signal RCL in response to a value of the register. The burst length BL indicates a number of times of a data signal output from a data terminal DQ in response to one read command RD or a number of times of a data signal received by the data terminal DQ in response to one write command WR. The read latency RCL corresponds to a number of clocks until initial read data is output from the data terminal DQ after the read command RD is received. The mode register 16 includes a configuration register.

The address input buffer 18 outputs an address signal AD received by an address terminal as an internal address signal IAD. The address latch circuit 20 latches the address signal IAD, which is supplied in synchronization with the row address strobe signal /RAS, for example, a row address signal into a row address latch and outputs the latched signal as a row address signal RAD. The row address signal RAD is used to select the word line WL. The address latch circuit 20 latches the address signal IAD, which is supplied in synchronization with the column address strobe signal /CAS, for example, a column address signal into a column address latch and outputs the latched signal as a column address signal CAD. The address latch circuit 20 includes an internal address generation circuit for generating the column address signal CAD succeeding to the address signal IAD supplied in synchronization with the column address strobe signal /CAS, for example, the column address signal. The internal address generation circuit generates the column address signal having a number smaller than the burst length BL by 1.

The bit width switch circuit 22 includes a connection wire CW 1 for coupling a bit width switch signal line X32Z to a power supply line VDD or to a ground line VSS. When the connection wire CW 1 is coupled to the power supply line VDD, the bit width switch signal X32Z is set to a high level. When the connection wire CW 1 is coupled to the ground line VSS, the bit width switch signal X32Z is set to a low level. When the bit width switch signal X32Z is set to the high level, the semiconductor memory MEM sets the bus width of the data signal DQ to 32 bits (narrow bit mode NBM). When the bit width switch signal X32Z is set to the low level, the semiconductor memory MEM sets the bus width of the data signal DQ to 64 bits (wide bit mode WBM). The connection wire CW 1 may be formed using an uppermost metal wire layer formed on the semiconductor memory MEM. The connection wire CW 1 is formed at, for example, a wire process at the end of semiconductor manufacturing processes. Since the bus width of the data signal DQ is switched at the end of manufacturing processes, the semiconductor memory MEM which satisfies market needs may be promptly prepared and shipped as needed.

The bit width switch circuit 22 may be coupled to the bit width switch signal line X32Z and may include a pair of transistors which are turned on and off by a value of the mode register 16. A source of one of the pair of transistors is coupled to the power supply line VDD, a drain thereof is coupled to the bit width switch signal line X32Z, and a gate thereof is coupled to an output of the mode register 16. A source of the other of the pair of transistors is coupled to the ground line VSS, a drain thereof is coupled to the bit width switch signal line X32Z, and a gate thereof is coupled to the output of the mode register 16. For example, one of the transistors may be a pMOS transistor, and the other of them may be an nMOS transistor. The mode register 16 is set during a power-on sequence of the semiconductor memory MEM and supplies a high level or a low level to the gates of the pair of transistors. The level of the bit width switch signal X32Z is set to a high level or a low level while the power of the semiconductor memory MEM is turned on.

The bit width switch circuit 22 may include a fuse circuit. The fuse circuit includes, for example, a high resistance element, and a fuse interposed in series between the power supply line VDD and the grounding line VSS. The bit width switch signal line X32Z is coupled to a connection node for coupling the high resistance element and the fuse to each other. The fuse is programmed at a manufacturing process of the semiconductor memory MEM. When the fuse is programmed, for example, when it is cut, the level of the bit width switch signal X32Z is set to the high level by the bit width switch signal line X32Z being coupled to the power supply line VDD through the high resistance element. When the fuse is not programmed, for example, when it is not cut, the level of the bit width switch signal X32Z is set to the low level by the bit width switch signal line X32Z being coupled to the ground line VSS through the fuse. The fuse may include, for example, a laser fuse programmed using a laser processing device. The laser fuse is formed using polysilicon and the like. The fuse may include an electric fuse programmed by an excess current. The electric fuse is formed making use of a contact unit such as a plug and the like. The fuse may include a non-volatile memory cell.

The data input/output buffer 24 receives a data signal, which is supplied to data terminals DQ (DQ 0-31) in synchronization with the write command WR, through data wires DQWE (DQE 0-31) and outputs the received data signal to data buses BUSE 0-31. The data input/output buffer 24 receives read data output from the memory cell arrays ARY to the data buses BUSE in response to the read command RD and outputs the received data signal to the data terminals DQ through the data wires DQWE.

The data input/output buffer 26 receives a data signal, which is supplied to data terminals DQ (DQ 32-63) in synchronization with the write command WR through data wires DQWO (DQWO 0-31) and outputs the received data signal to the data buses BUSO 0-31. The data input/output buffer 26 receives read data output from the memory cell arrays ARY to the data buses BUSO in response to the read command RD and outputs the received data signal to the data terminals DQ through the data wires DQWO.

In the semiconductor memory MEM illustrated in FIG. 1, since the bit width switch signal X32Z is set to, for example, the high level, the bit width of the data signal DQ of the semiconductor memory MEM is 32 bit. In the 32-bit memory, for example, the data terminal DQ 0 is coupled to the data terminal DQ 32 by a connection wire CW 2. The data terminals DQ 1 and DQ 33 are coupled to each other, the data terminal DQ 2 and the data terminal DQ 34 are coupled to each other, and the data terminal DQ 31 and the data terminal DQ 63 are coupled to each other. When the number of the data terminals is indicated by a 6-bit binary number, the data terminals DQ having the same lower five bits are coupled to each other. Two data terminals DQ may be coupled to each other by a different rule. The data terminals DQ include data pads DQ.

The connection wire CW 2 may be formed using an uppermost metal wire layer formed on the semiconductor memory MEM likewise the connection wire CW 1. The data wires DQWE may be coupled to the data wires DQWO by the connection wire CW 2.

In the 32-bit memory, the data input/output buffers 24 and 26 receive substantially the same data signal from the data buses BUSE or BUSO and output the received data signal to the data wires DQWE or DQWO. A 1-bit read data signal is output from two data output circuits. Accordingly, a transistor size of data output circuits OUTTR formed in the respective data input/output buffers 24 and 26 is reduced to thereby reduce a chip size of the semiconductor memory MEM.

The transistor size is indicated by, for example, a gate width of a transistor. The size of transistors of the data output circuits OUTTR may be larger than that of transistors included in a logic circuit. Accordingly, the chip size is greatly reduced. In a 32-bit memory including a data signal DQ having a relatively small bit width, all the data output circuits OUTTR may be used. Accordingly, the data input/output, buffer 26 formed on a chip of the semiconductor memory MEM may be efficiently used.

The memory core 28 includes the plurality of memory cell arrays ARY, word decoders WDEC corresponding to the respective memory cell arrays ARY, sense amplifier regions SAA interposed between the memory cell arrays ARY, a column decoder CDEC, the read amplifier RA, the write amplifier WA, and a bus switch circuit BSW. The respective memory cell arrays ARY may have substantially the same arrays ARE and substantially the same arrays ARO.

The arrays ARE may be selected when a least significant bit CADa of the column address signal CAD is a logic "0," for example, an even number. The arrays ARO may be selected when the least significant bit CADa of the column address signal CAD is a logic "1," for example, an odd number. The sense amplifier regions SAA, the column decoders CDEC, the read amplifiers RA and the write amplifier WA are formed corresponding to the arrays ARE and ARO, respectively.

The respective memory cell arrays ARY include a plurality of the word lines WL coupled to the columns of the memory cells MC arranged in a lateral direction of FIG. 1 and a plurality of the bit lines BL coupled to the columns of the memory cells MC arranged in a longitudinal direction of FIG. 1. Each memory cell MC includes a capacitor for holding data as a charge and a transfer transistor for coupling an end of the capacitor to a bit line BL. The other end of the capacitor is coupled to a reference voltage line. A reference voltage supplied to the reference voltage line may be, for example, a precharge voltage VPR. The bit lines BL may be a single signal line or may be a complementary signal line.

The sense amplifier regions SAA include precharge circuits and connection switches corresponding to the respective memory cell arrays ARY, and sense amplifiers and column switches shared by a pair of adjacent memory cell arrays ARY. The precharge circuits couple the bit line pairs BL to a precharge voltage line in synchronization with the precharge control signal. The connection switches selectively couple one of the bit lines BL of a pair of the memory cell arrays ARY to the sense amplifiers and the column switches. The respective sense amplifiers are operated in synchronization with the sense amplifier control signal.

The respective column switches are turned on in response to a column selection signal and couple the bit lines BL to upper data lines, for example, global bit lines. The upper data lines are coupled to the read amplifiers RA and the write amplifiers WA. For example, 512 column switches (64 DQ×8 bits) are turned on in response to a common column selection signal. One column selection signal line is commonly coupled to eight column switches of each data pad DQ. Four column switches CSW of the eight column switches CSW are coupled to the arrays ARE, and the remaining four column switches CSW are coupled to the arrays ARO.

For example, in a read operation, 256-bit data from the arrays ARE, for example, 4-bit data of each data pad DQ, 256-bit data from the arrays ARO, and 4-bit data of each data pad DQ are transferred to the read amplifiers RA. In a write operation, 256-bit data, for example, 4-bit data of each data pad DQ is transferred from the write amplifiers WA to the arrays ARE, and 256-bit data, for example, 4-bit data of each data pad DQ is transferred from the write amplifiers WA to the pads DQ. An operation of the sense amplifier regions SAA may be substantially the same as that of a sense amplifier included in an ordinary DRAM.

The word decoders WDEC decode the row address signal RAD to select one of the word lines WL. The column decoders CDEC decode the column address signal CAD to select the bit number of the data pads DQ, for example, to select the bit lines BL of an integral multiple of 64, and output a column selection signal to turn on a given number of column switches. For example, the "integral multiple" may be a value equal to a maximum value of the burst length BL, for example, "8." The "given number" may be "512" which is obtained by multiplying the maximum value of the burst length BL by the number of the data pad DQ, for example, 64.

In a read operation, the read amplifiers RA amplify a read data signal output through the column switches and output them to the bus switch circuits BSW. The read amplifiers RA determine an output sequence of the read data according any value of the lower bits excluding the least significant bits CADa, for example, 1 bit, 2 bits, and 3 bits in the column address signal CAD. The number of lower bits is set according to the burst length BL. In the write operation, the write amplifiers WA amplify write data signal supplied through the bus switch circuits BSW and outputs them to the bit lines BL. The write amplifiers WA determine an input sequence of the write data according any value of the lower bits excluding the least significant bits CADa, for example, 1 bit, 2 bits, or 3 bits in the column address signal CAD.

When the column address signal CADa indicates the arrays ARE at the time the bit width switch signal X32Z is set to the high level, the bus switch circuits BSW couple the read amplifiers RA and the write amplifiers WA, which correspond to the arrays ARE, to both the data buses BUSE and the data buses BUSO through connection wires CWEE and CWEO. When the column address signal CADa indicates the arrays ARO, the bus switch circuits BSW couple the read amplifiers RA and the write amplifiers WA, which correspond to the arrays ARO, to both the data buses BUSE and the data buses BUSO through connection wires CWOE and CWOO.

The first embodiment may be applied to a pseudo SRAM. For example, the command signal CMD includes a chip enable signal /CE, a write enable signal /WE or an output enable signal /OE. The command decoder 12 decodes the read command RD, the write command WR, or a mode register setting command MRS. The core control circuit 14 includes a refresh request generation circuit for periodically generating an internal refresh command, for example, an internal refresh request signal to periodically execute a refresh operation, and an arbiter for determining the priority of an access operation and a refresh operation when an external access command, for example, the read command signal RDZ or the write command signal WRZ competes with the internal refresh command.

Figure 2:
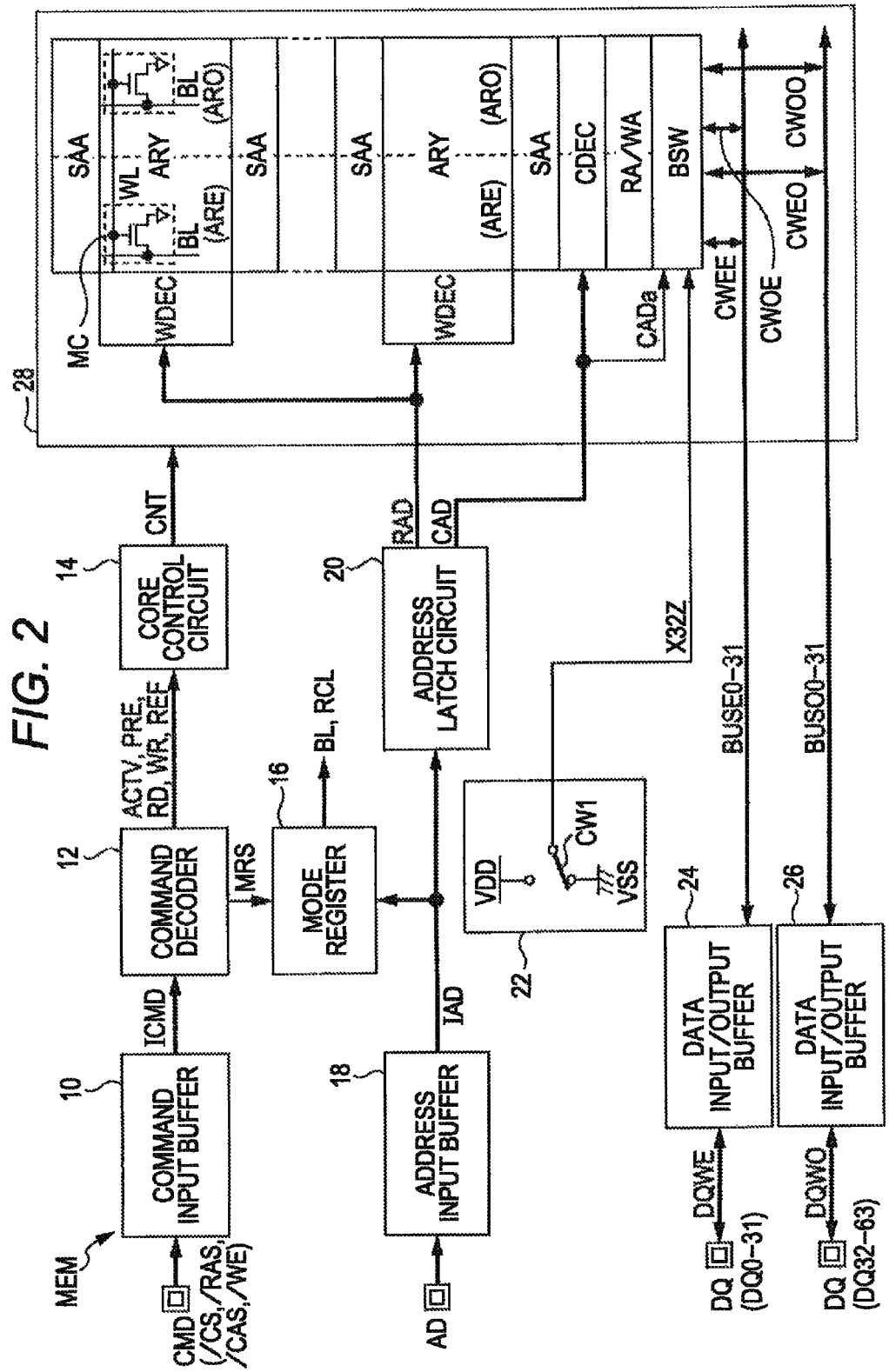
FIG. 2 illustrates a second embodiment.

FIG. 2 illustrates a second embodiment. A connection wire CW 1 is coupled to a ground line VSS, and a bit width switch signal X32Z is set to a low level. Accordingly, the bus width of a data signal of a semiconductor memory MEM illustrated in FIG. 2 is set to 64 bits (64-bit memory). Since data pads DQ 0-31 and data pads DQ 32-63 are supplied with data signals different from each other, the semiconductor memory illustrated in FIG. 2 may not include, for example, the connection wire CW 2 illustrated in FIG. 1. The other arrangement of the semiconductor memory illustrated in FIG. 2 may be substantially the same as or similar to that illustrated in FIG. 1.

When the bit width switch signal X32Z is set to the low level, a bus switch circuit BSW couples read amplifiers RA and write amplifiers WA corresponding to arrays ARE to data buses BUSE through a connection wire CWEE regardless of a value of a column address signal CADa. The bus switch circuit BSW couples read amplifiers RA and write amplifiers WA corresponding to arrays ARO to a data buses BUSO through the connection wire CWOO regardless of the value of the column address signal CADa.

Figure 3:
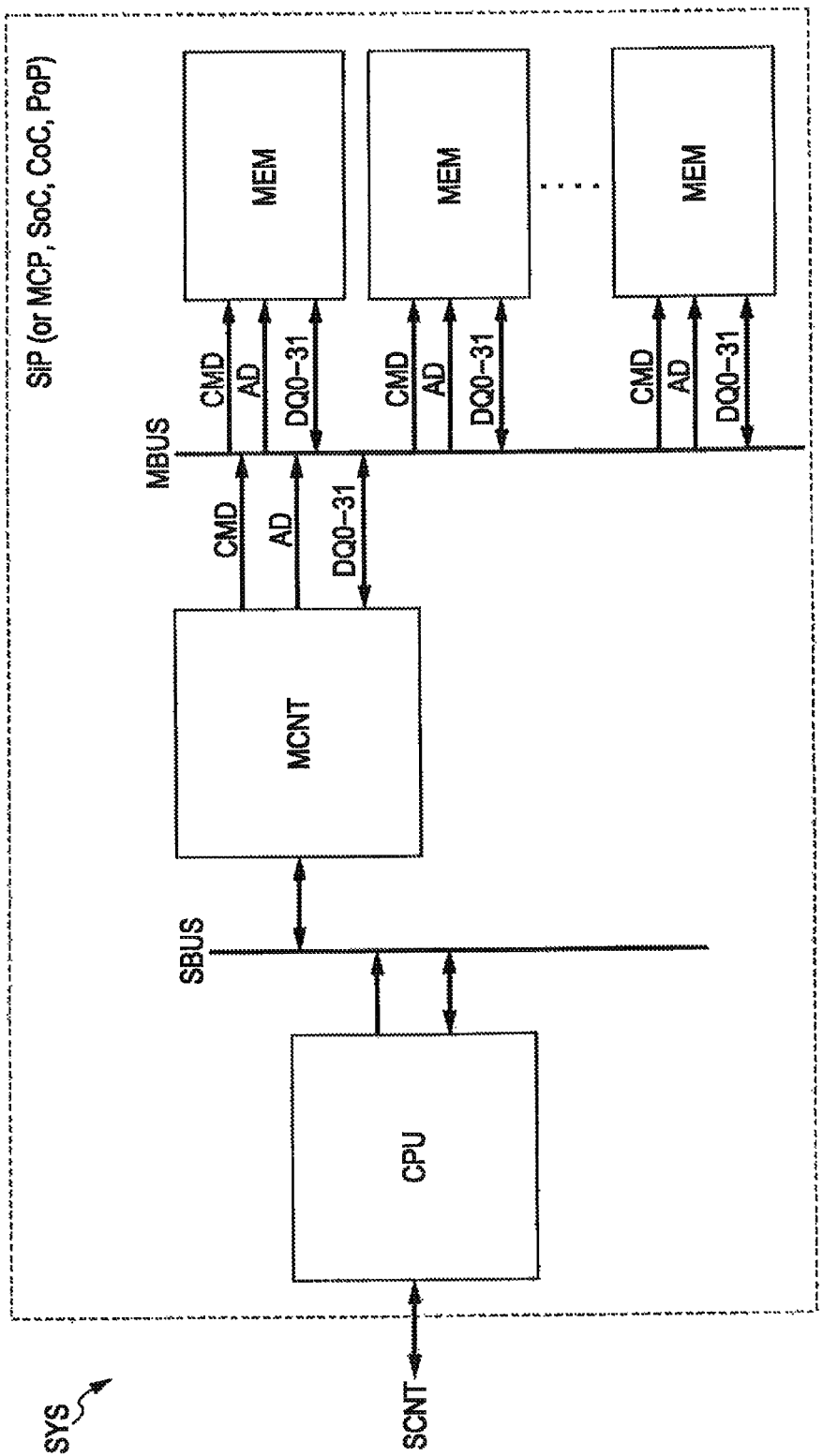
FIG. 3 illustrates an exemplary system including a semiconductor memory.

FIG. 3 illustrates an exemplary system in which semiconductor memories is included. The semiconductor memories illustrated in FIG. 3 may be the semiconductor memory illustrated in FIG. 1 or 2. The semiconductor memories MEM include 32-bit data terminals DQ 0-31. The system SYS, for example, a user system includes at least a part of a video recorder or a computer device such as a personal computer. The system SYS of FIG. 3 may include at least a part of, for example, a mobile device such as a mobile phone, and a mobile game.

The system SYS includes a system-in-package SiP having a plurality of chips mounted on a package substrate such as a read frame. The system SYS includes a multi-chip package MCP having a plurality of chips laminated on a package substrate. The system SYS includes a system-on-chip SoC having a plurality of macros laminated on a silicon substrate. The system SYS may include a chip-on-chip CoC, a package-on-package PoP, or a print substrate. A print substrate on which a packaged CPU is mounted may include a memory module including a memory controller MCNT and a plurality of the semiconductor memories MEM.

For example, the system-in-package SiP includes the plurality of semiconductor memories MEM, the memory controller MCNT for accessing the semiconductor memories MEM, and a CPU (main controller) for controlling the system. The semiconductor memories may be the semiconductor memory illustrated in FIG. 1 or 2. The semiconductor memories MEM may be identified by a chip selection signal /CS. The system-in-package SiP is coupled to an upper system through an external bus SCNT. The CPU and the memory controller MCNT are coupled to each other through a system bus SBUS. The memory controller MCNT and the semiconductor memories MEM are coupled to each other through a memory bus MBUS. A chip of other peripheral circuit may be coupled to the system bus SBUS.

The CPU outputs a read packet such as a read access request or a write packet, such as a write access request to the memory controller MCNT to access the semiconductor memories MEM. The memory controller MCNT outputs a command signal CMD, an address signal AD or a write data signal DQ to the semiconductor memories MEM in response to a command from the CPU and receives a read data signal DQ from the semiconductor memories MEM. The system SYS may not include the memory controller MCNT, and the CPU may directly output the command signal CMD and the address signal AD to the semiconductor memories MEM.

The memory bus MBUS includes a common address signal line AD or a common data signal line DQ. In the command signal line CMD on the memory bus MBUS, the chip selection signal /CS, for example, may be wired to each semiconductor memory MEM, and in the other command signal line CMD, the chip selection signal /CS may be commonly wired to the semiconductor memories MEM. When the plurality of semiconductor memories MEM are coupled to the common memory bus MBUS, a load on the data signal lines DQ is increased. Accordingly, data output circuits of data input/output circuits 24 and 26 may have a relatively large drive capability. In FIG. 1, a relatively large drive capability is secured by driving respective bits of the data signal lines DQ by the plurality of data output circuits OUTTR.

When a large drive capability is required, the data output circuits OUTTR corresponding to the data pads DQ 32-63 are used in a narrow bit mode NBM. Accordingly, the drive capabilities of the respective data output circuits OUTTR of the data input/output circuits 24 and 26 are small and reduced to, for example, one half and thus a chip size of the semiconductor memories MEM is reduced.

Figure 4:
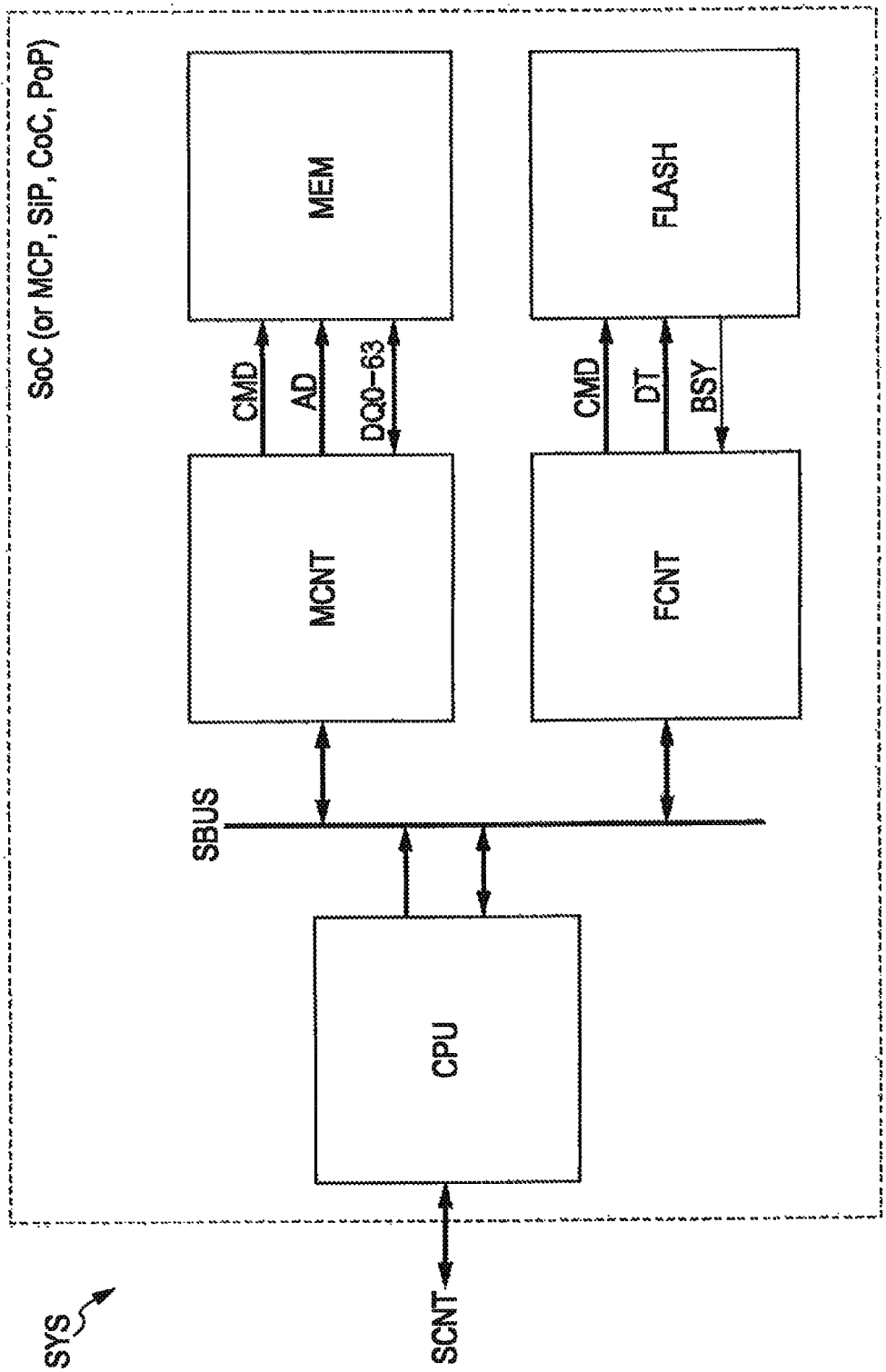
FIG. 4 illustrates another exemplary system including a semiconductor memory.

FIG. 4 illustrates another exemplary system including a semiconductor memory. The semiconductor memory illustrated in FIG. 4 may be the semiconductor memory MEM illustrated in FIG. 2. The semiconductor memory MEM includes 64-bit data terminals DQ 0-63. A system SYS (user system) illustrated in FIG. 4 may include at least a part of, for example, a mobile equipment such as a mobile phone, or a mobile game. The system SYS of FIG. 4 may include at least a part of a video recorder or a computer device such as a personal computer.

The system SYS may include a system-on-chip SoC. The system SYS may include a multi-chip package MCP, a system-in-package SiP, a chip-on-chip CoC, a package-on-package PoP, or a print substrate.

For example, the system-on-chip SOC includes the semiconductor memory MEM illustrated in FIG. 2, a memory controller MCNT for accessing the semiconductor memory MEM, a flash memory FLASH, a memory controller FCNT for accessing the flash memory FLASH, and a CPU (main controller) for controlling the system. The CPU and the memory controllers MCNT and FCNT are coupled to each other through a system bus SBUS. The system-on-chip SoC is coupled to an upper system through an external bus SCNT. A chip of other peripheral circuit may be coupled to the system bus SBUS.

The CPU outputs a read packet such as a read access request and a write packet such as a write access request to the memory controller MCNT to access the semiconductor memories MEM. The memory controller MCNT accesses one semiconductor memory MEM. An operation of the memory controller MCNT may be substantially the same as that of the memory controller MCNT illustrated in FIG. 3. The CPU outputs a read packet such as a read access request, a write packet such as a write access request, and a delete packet such as a delete request to the memory controller FCNT to access the flash memory FLASH. The memory controller FCNT outputs a command signal CMD and a write data signal DT to the flash memory FLASH in response to a command from the CPU and receives a read data signal DT and a busy signal BSY from flash memory FLASH. An address signal is supplied to the flash memory FLASH through a data line DT. The system SYS may not be provided with the memory controller MCNT, and the CPU may output the command signal CMD and the address signal AD to the semiconductor memories MEM. The system SYS may include only the CPU and the semiconductor memories MEM.

When the semiconductor memories MEM are coupled to the memory controller MCNT or coupled to the CPU, a load on the data signal lines DQ becomes relatively small. Accordingly, the data output circuits of the data input/output circuits 24 and 26 may have a relatively small drive capability. For example, in the second embodiment, since each bit of the data signal lines DQ is driven by one data output circuit OUTTR, the data output circuits OUTTR may have a reduced drive capability. Since all the data output circuits OUTTR are used regardless of the number of bits of the data terminals DQ, the chip size of the semiconductor memories MEM is reduced. Semiconductor memories MEM of a following embodiment may be mounted on the system SYS illustrated in FIG. 3 or 4.

Figure 5:
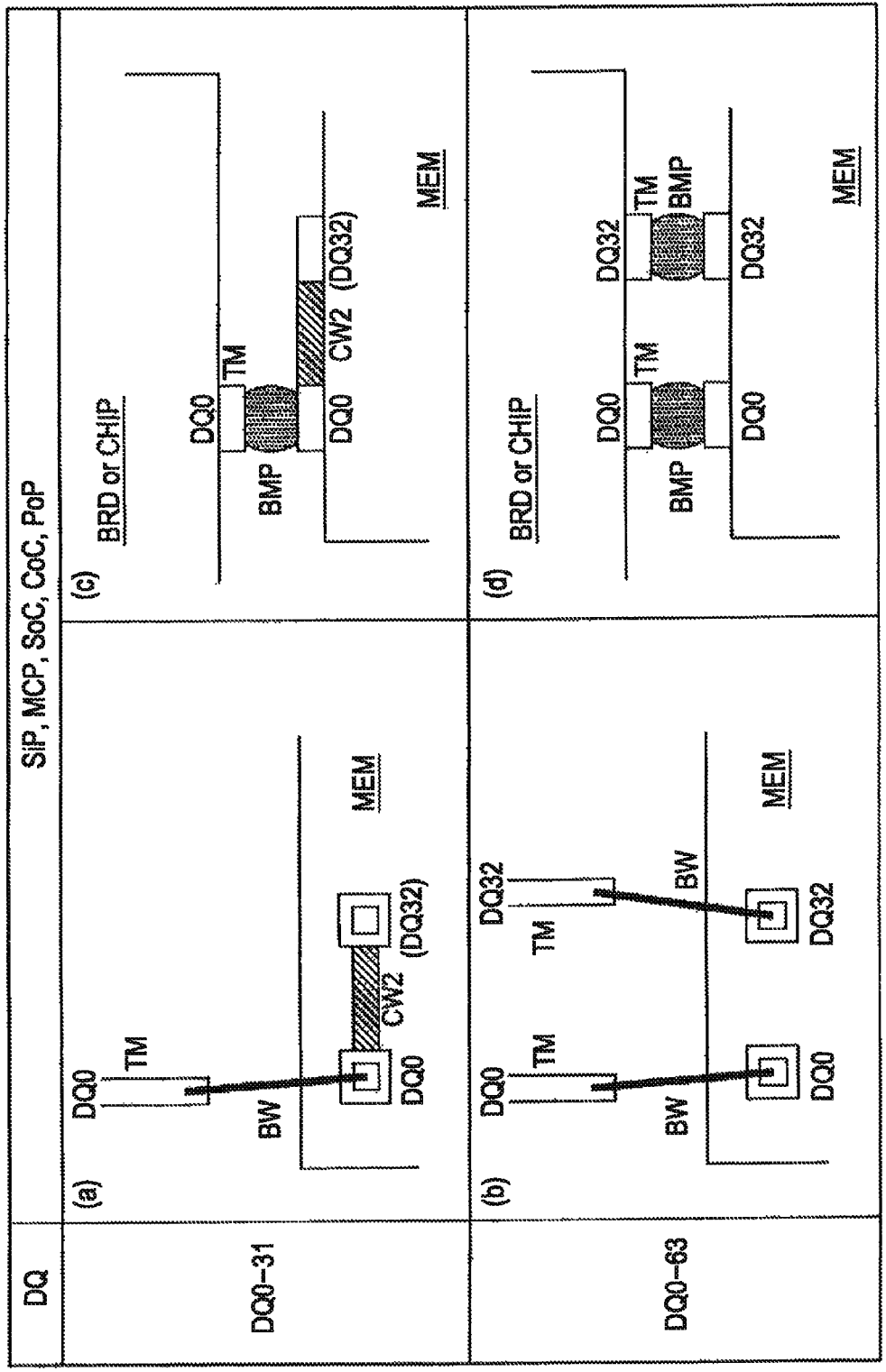
FIG. 5 illustrates an exemplary data pad connection.

FIG. 5 illustrates an exemplary data pad connection. The data pads illustrated in FIG. 5 may be included the semiconductor memories MEM illustrated in FIG. 3 or 4. Other data pads DQ which are not illustrated in FIG. 5 may be also coupled likewise FIG. 5.

For example, the data pads DQ of the semiconductor memories MEM are coupled to external terminals TM and the like by bonding wires BW ((a) and (b) of FIG. 5). The terminals TM are formed on a SiP substrate. The semiconductor memories MEM may be mounted on a single package. When the semiconductor memories MEM are mounted on the single package, the bonding wires BW are coupled to leads of lead frames. When the system SYS includes the multi-chip package MCP, the data pads DQ are coupled to external pads. When the semiconductor memories MEM are used in the narrow bit mode NBM, each bonding wire BW is coupled to one of a pair of the data pads DQ coupled by a connection wire CW 2 ((a) of FIG. 5). When the semiconductor memories MEM are used in a wide bit mode WBM, the bonding wires BW are coupled to the respective data pads DQ ((b) of FIG. 5).

The data pads DQ of the semiconductor memories MEM are coupled to the terminals TM on a substrate BRD or other semiconductor chip CHIP by bumps BMP ((c) and (d) of FIG. 5). When the semiconductor memories MEM are used in the narrow bit mode NBM, each bump BMP is coupled to one of a pair of the data pads DQ coupled by the connection wire CW 2 (part (c) of FIG. 5). When the semiconductor memories MEM are used in the wide bit mode WBM, the bumps BMP are coupled to the respective data pads DQ (part (d) of FIG. 5).

Figure 6:
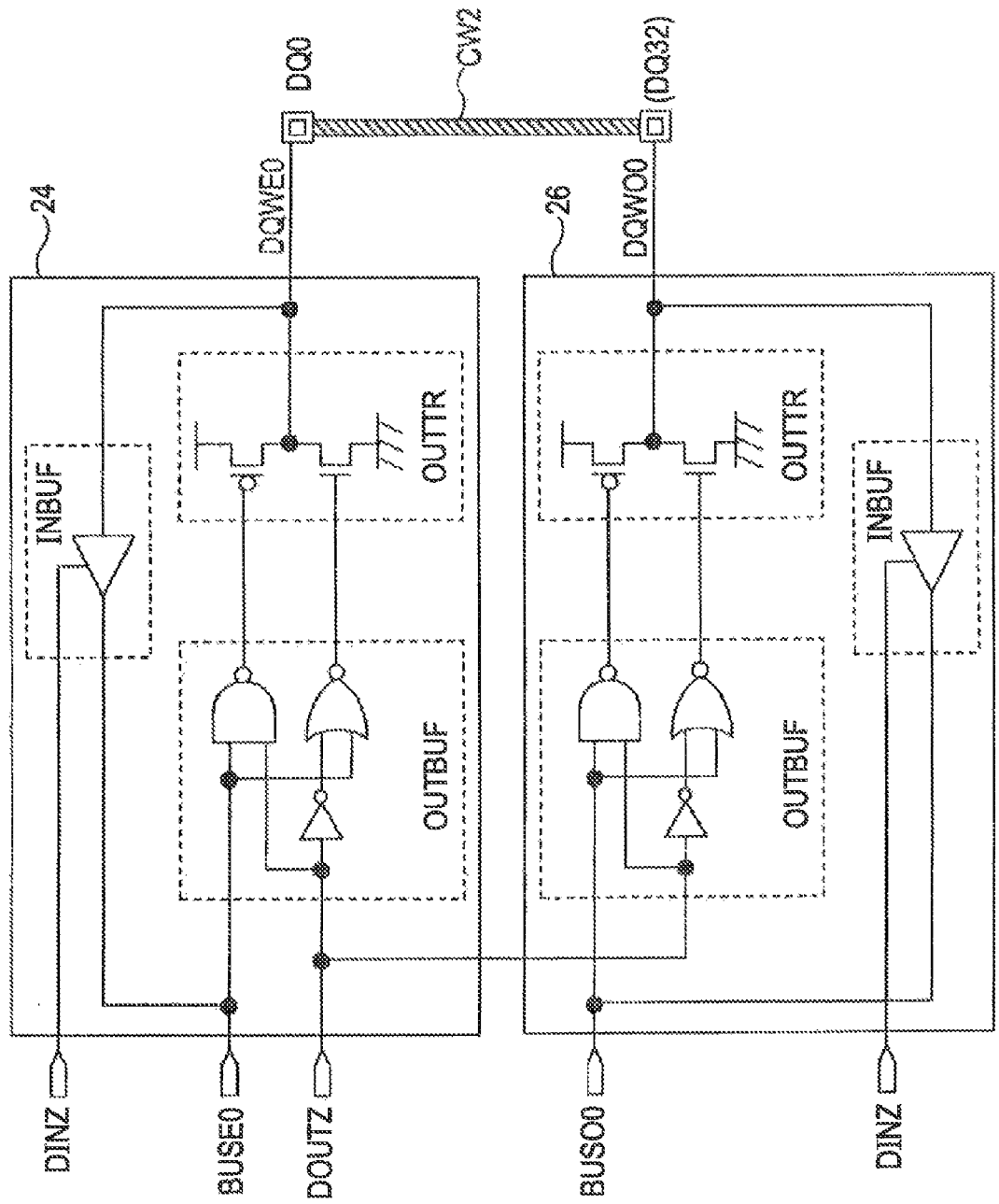
FIG. 6 illustrates an exemplary data input/output buffer.

FIG. 6 illustrates an exemplary data input/output buffer. The data input/output buffer illustrated in FIG. 6 may be the data input/output buffer 24 or 26 illustrated in FIG. 1. A data input/output buffer corresponding to other data pad DQ which is not illustrated in FIG. 6 may be substantially the same as or similar to the data input/output buffer 24 or 26 illustrated in FIG. 6.

The data input/output buffer 24 includes output buffers OUTBUF, data output circuits OUTTR, and input buffers INBUF. Each output buffer OUTBUF includes a NAND gate and a NOR gate (AND gates of negative logic) which become valid during a high level period of an output control signal DOUTZ. The output control signal DOUTZ is output from a core control circuit 14 in response to a read command RD. When read data transmitted to a data bus BUSE 0 is set a high level, the NAND gate outputs a low level signal. When the read data transmitted to the data bus BUSE 0 is set a low level, the NOR gate outputs a high level signal.

Each data output circuit OUTTR includes a pMOS transistor and an nMOS transistor coupled in series between a power supply line and a ground line. When the pMOS transistor receives a low level from the NAND gate, the pMOS transistor turns on and outputs a high level signal to a data line DQWE 0. When the nMOS transistor receives the high level from the NOR gate, the nMOS transistor turns on and outputs a low level signal to the data line DQWE 0. The input buffer INBUF outputs the level of the write data transmitted to the data line DQWE 0 to the data buses BUSE during a period in which a data input control signal DINE is set to the high level. The data input control signal DINE is output from the core control circuit 14 in response to a write command WR.

The data input/output buffer 26 may be substantially the same as the data input/output buffer 24. In the semiconductor memory MEM illustrated in FIG. 1, the data pad DQ 0 and the data pad DQ 32 are coupled to each other. Accordingly, in a read operation, the data input/output buffers 24 and 26 receive read data having the same logic from the data buses BUSE 0 or BUSO 0 and output them to the data line DQWE 0 or DQWO 0. They may be output contemporaneously. In a write operation, the data input/output buffers 24 and 26 receive write data having the same logic to be transmitted to the data line DQWE 0 or DQWO0 and output them to the data buses BUSE or BUSO. They may be output contemporaneously. The timing at which the output control signal DOUTZ is supplied to the data input/output buffer 24 may be different from the timing at which the output control signal DOUTZ is supplied to the data input/output buffer 26. At the time, the data output circuits OUTTR of the data input/output buffers 24 and 26 output the read data at a different timing to the data line DQWE 0 or DQWO 0. Power supply noise may be reduced because the two data output circuits OUTTR having a large drive capability are sequentially operated.

Figure 7:
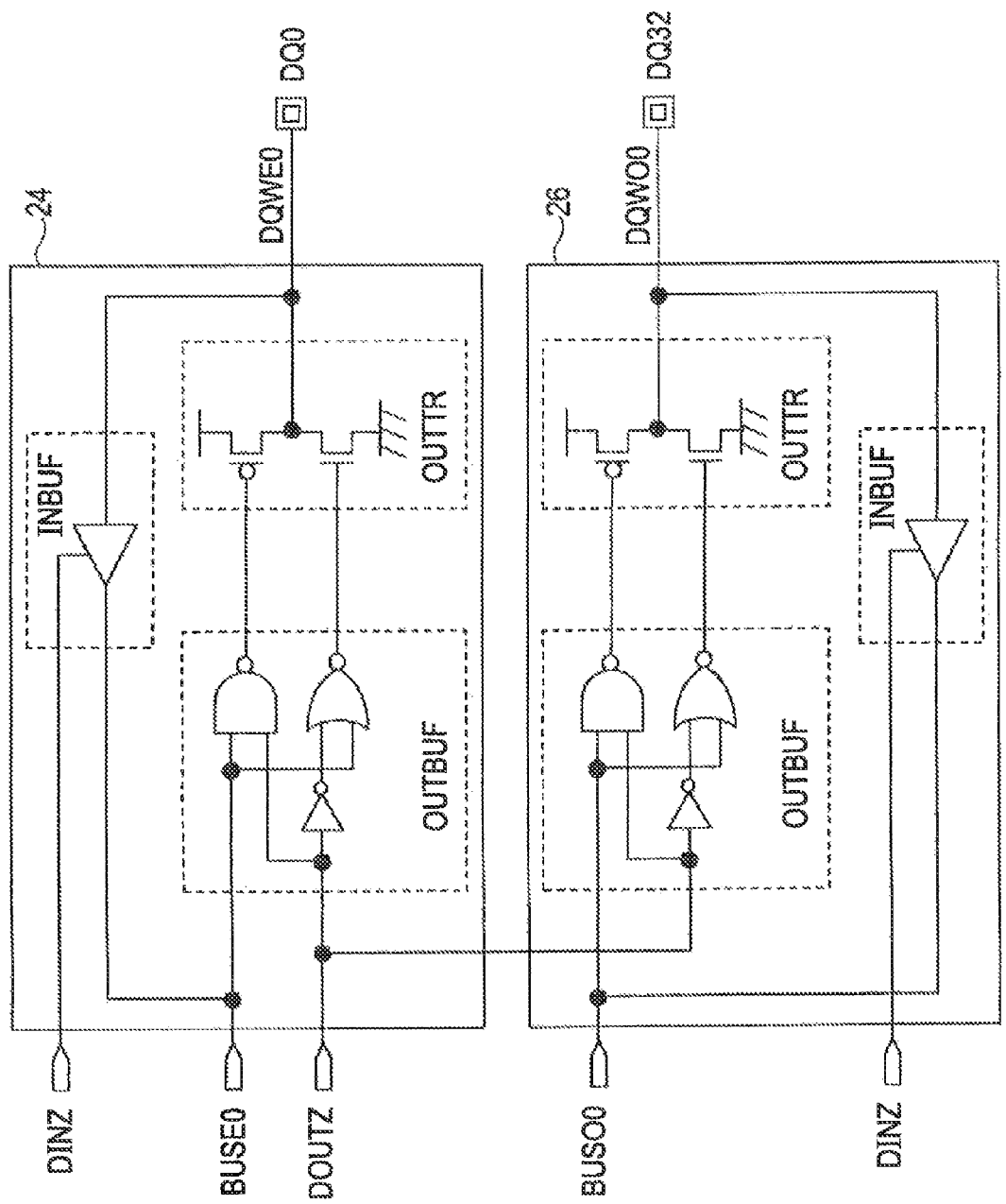
FIG. 7 illustrates another exemplary data input/output buffer.

FIG. 7 illustrates another exemplary data input/output buffer. The data input/output buffer illustrated in FIG. 7 may be the data input/output buffer 24 or 26 illustrated in FIG. 2. The data input/output buffer 24 or 26 may be substantially the same as or similar to the data input/output buffer illustrated in FIG. 6. Since data pads DQ 0 and DQ 32 are not coupled to each other, different data is transmitted to each of them. Accordingly, the data input/output buffers 24 and 26 output or input different data, respectively. Operations of the data input/output buffers 24 and 26 may be substantially the same as or similar to that of the data input/output buffer illustrated in FIG. 6.

Figure 8:
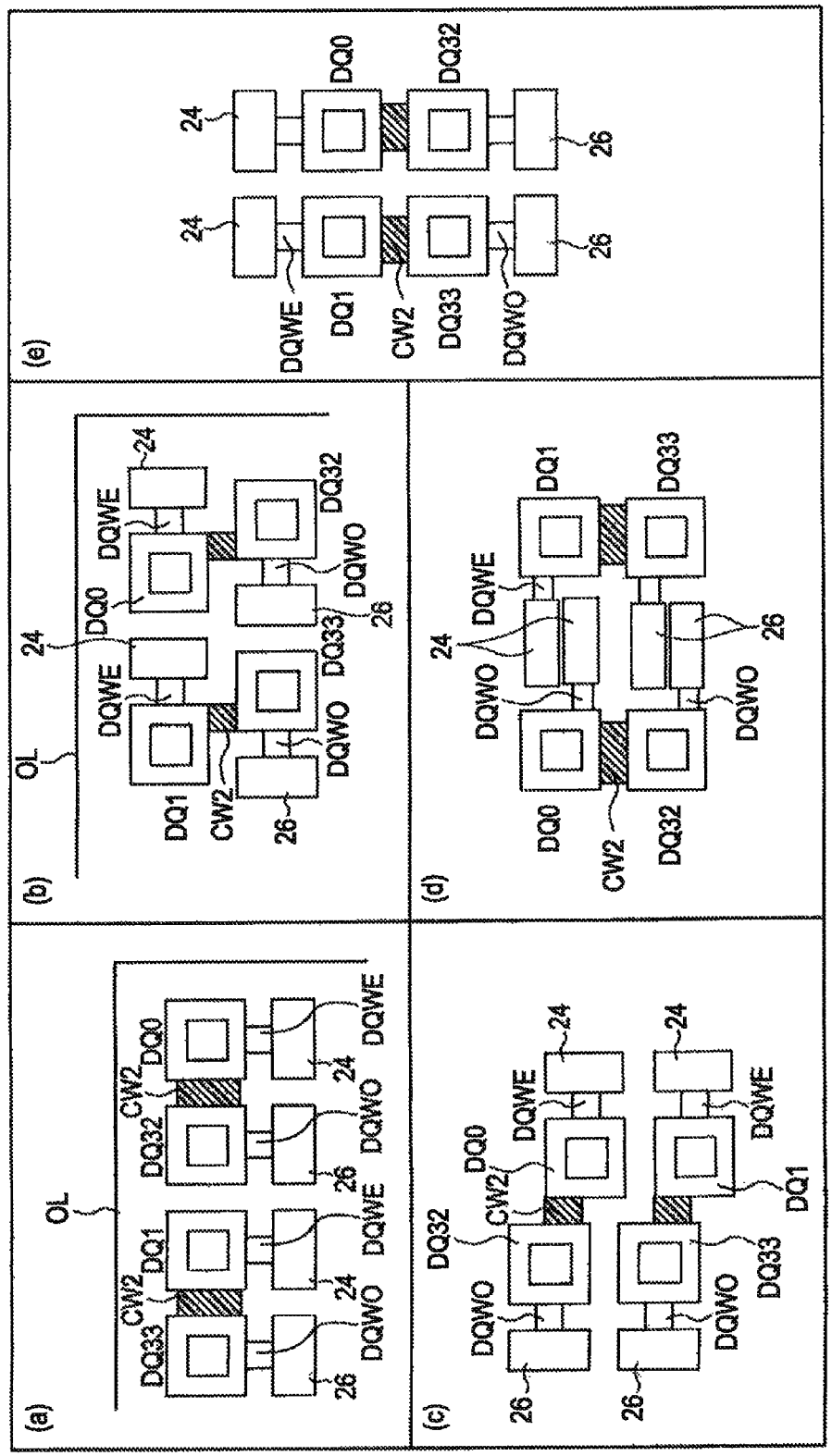
FIG. 8 illustrates an exemplary layout of a data input/output buffer.

FIG. 8 illustrates an exemplary layout of a data input/output buffer. The data input/output buffer illustrated in FIG. 8 may be the data input/output buffers 24 and 26 illustrated in FIGS. 1 and 2. In FIG. 8A and FIG. 8B, the data pads DQ are formed around an outer peripheral portion OL of a chip of the semiconductor memory MEM. In FIG. 8C, FIG. 8D and FIG. 8E, the data pads DQ are formed internally of the chip of the semiconductor memory MEM.

Figure 9:
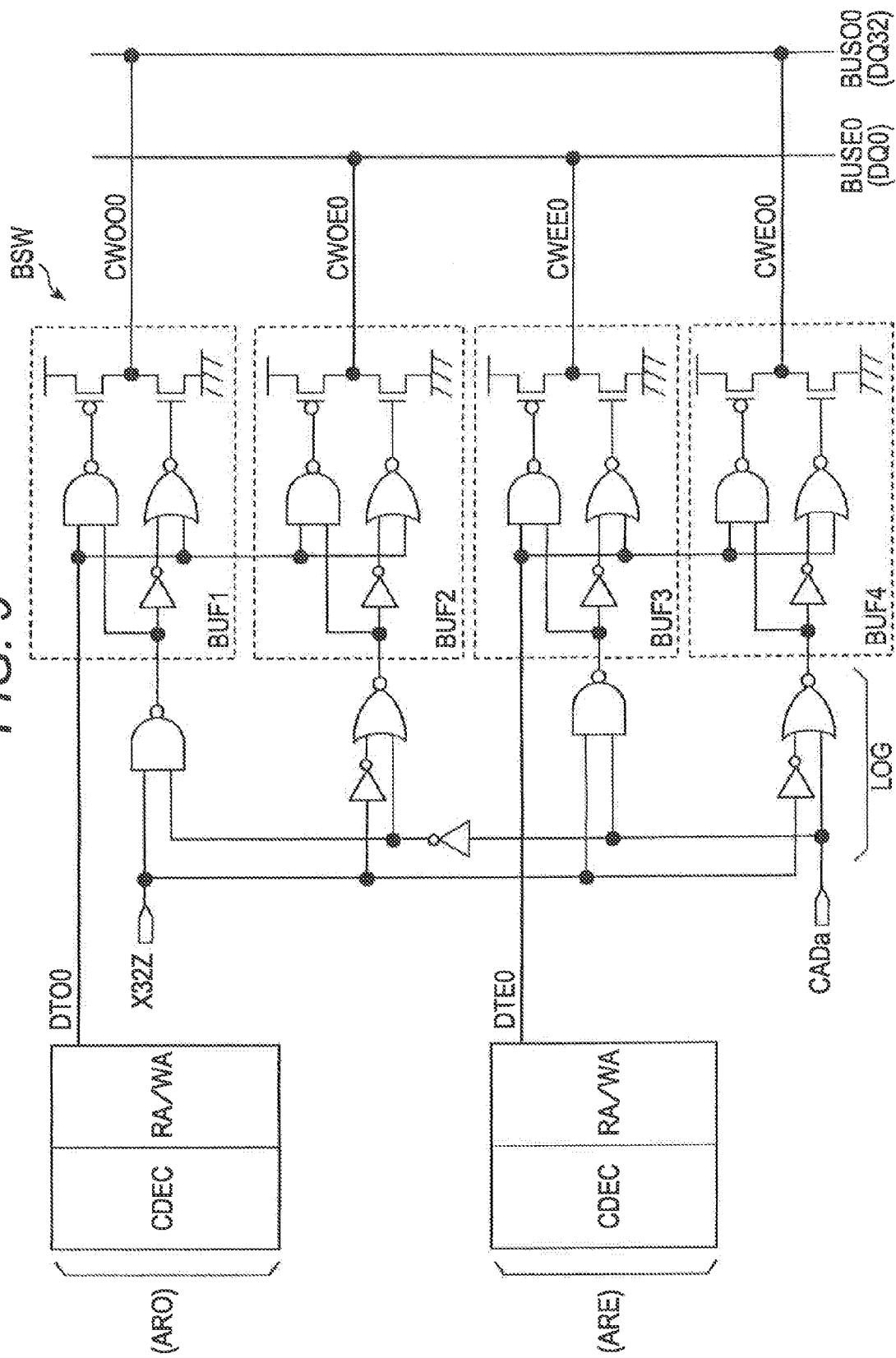
FIG. 9 illustrates an exemplary bus switch circuit.

FIG. 9 illustrates an exemplary bus switch circuit. The bus switch circuit illustrated in FIG. 9 may be the bus switch circuit BSW illustrated in FIGS. 1 and 2. Bus switch circuits BSW corresponding to other data pads DQ which are not illustrated in FIG. 9 may be substantially the same as or similar to the bus switch circuit illustrated in FIG. 9. The bus switch circuit BSW may be formed internally of at least one of the read amplifiers RA and the write amplifiers WA.

The bus switch circuit BSW includes read buffer circuits BUF 1-4 whose outputs are coupled to connection wires CWOO 0, CWOE 0, CWEE 0, and CWEO 0, respectively and a logic circuit LOG for controlling the read buffer circuits BUF 1-4. Each of the read buffer circuits BUF 1-4 includes, for example, an output buffer OUTBUF and a data output circuit OUTTR illustrated in FIG. 6. The read buffer circuits BUF 1-4 are activated when the read command RD is supplied thereto and operates in response to the bit width switch signal X32Z and the column address signal CADa.

The read buffer circuit BUF 1 operates when it is in the narrow bit mode NBM, for example, when the bit width switch signal X32Z is set to the high level and the column address signal CADa is set to the high level or when it is in the wide bit mode WBM, for example, when the bit width switch signal X32Z is set to the low level. The read buffer circuit BUF 1 outputs a data signal, which is read from arrays ARO to an internal data line DTO 0, to a data bus BUSO 0 through a connection wire CWOO 0. The read-out buffer circuit BUF 2 operates when the column address signal CADa is set to the high level in the narrow bit mode NBM. The read buffer circuit BUF 2 outputs a data signal read from the arrays ARO to the internal data line DTO 0 to a data bus BUSE 0 through a connection wire CWOE 0.

The read-out buffer circuit BUF 3 operates when the column address signal CADa is set to the low level in the narrow bit mode NBM or when it is in the wide bit mode WBM. The read buffer circuit BUF 3 outputs a data signal read out from the arrays ARE to an internal data line DTE 0 to the data bus BUSE 0 through the connection wire CWEE 0. The read buffer circuit BUF 4 operates when the column address signal CADa is set to the low level in the narrow bit mode NBM. The read buffer circuit BUF 4 outputs a data signal read out from the arrays ARE to the internal data line DTE 0 to the data bus BUSO 0 through the connection wire CWEO 0.

The bus switch circuit illustrated in FIG. 9 may not include write buffer circuits for transmitting write data to the write amplifiers WA from the data buses BUSE 0 and BUSO 0 through the internal data lines DTE 0 and DTO 0. For example, the write buffer circuits may be substantially the same circuits as the read buffer circuits BUF 1-4. Inputs of the four write buffer circuits are coupled to the connection wires CWOO 0, CWOE 0, CWEE 0, and CWEO 0, respectively, and outputs of the four write buffers circuit are coupled to the internal data lines DTO 0, DTO 0, DTE 0 and DTE 0, respectively. The write buffer circuits are activated when the write command WR is supplied thereto and may execute substantially the same operation as that of the read buffer circuits BUF 1-4 in response to the bit width switch signal X32Z and the column address signal CADa.

FIG. 10 illustrates an exemplary operation of a bus switch circuit. The bus switch circuit whose operation is illustrated in FIG. 10 may be the bus switch circuit SSW illustrated in FIG. 9. Symbols ◯ in FIG. 10 indicate the read buffer circuits BUF (BUF 1-4) which output data. Symbols X in FIG. 10 indicate the read buffer circuits BUF which is prohibited from outputting data.

In the narrow bit mode NBM in which the bit width of the data signal DQ is set to 32 bit, for example, to DQ 31, the read buffer circuits BUF 1-2 or the read buffer circuits BUF 3-4 are activated in response to the column address signal CADa. In the read operation, the read data from the arrays ARE or arrays ARO, for example, DTE or DTO is output to the data buses BUSE and BUSO in response to the column address signal CADa. Since the common read data is output to the data buses BUSE and BUSO, the read data is output to the data terminals DQ, for example, using two data output circuits OUTTR illustrated in FIG. 7. Accordingly, a transistor size of each data output circuit OUTTR may be small and, for example, becomes one half a conventional size.

In the write operation, the same write data transmitted to both the data buses BUSE and BUSO is supplied to an array ARE (DTE) or an array ARO (DTO) in response to the column address signal CADa. Accordingly, common write data received by the two data terminals DQ is securely written to the given arrays ARE or ARO.

In the wide bit mode WBM in which the bit width of the data signal DQ is set to 64 bits, for example, to DQ 0-63, the read buffer circuits BUF 1 and BUF 3 are activated, and the read buffer circuits BUF 2 and BUF 4 are deactivated. In the read operation, read data which are output from the arrays ARE and ARO and independent from each other, for example, DTE and DTO, are output to the data buses BUSE and BUSO, respectively. In the write operation, write buffer circuits, which correspond to the read buffer circuits BUF 1 and BUF 3, are activated. Write buffer circuits, which correspond to the read buffer circuits BUF 2 and BUF 4, are deactivated. Write data, which are independent from each other and transmitted to the data buses BUSE and BUSO, are supplied to the array ARE (DTE) and the array ARO (DTO).

In the previous embodiment, the read data is output to the one data pad DQ using the two data output circuits OUTTR in the narrow bit mode NBM. Accordingly, the drive capabilities of the respective data output circuits OUTTR become relatively small. Since the transistor size of each data output circuit OUTTR may become, for example, one half the conventional size, the chip size of the semiconductor memories MEM may be reduced.

Figure 11:
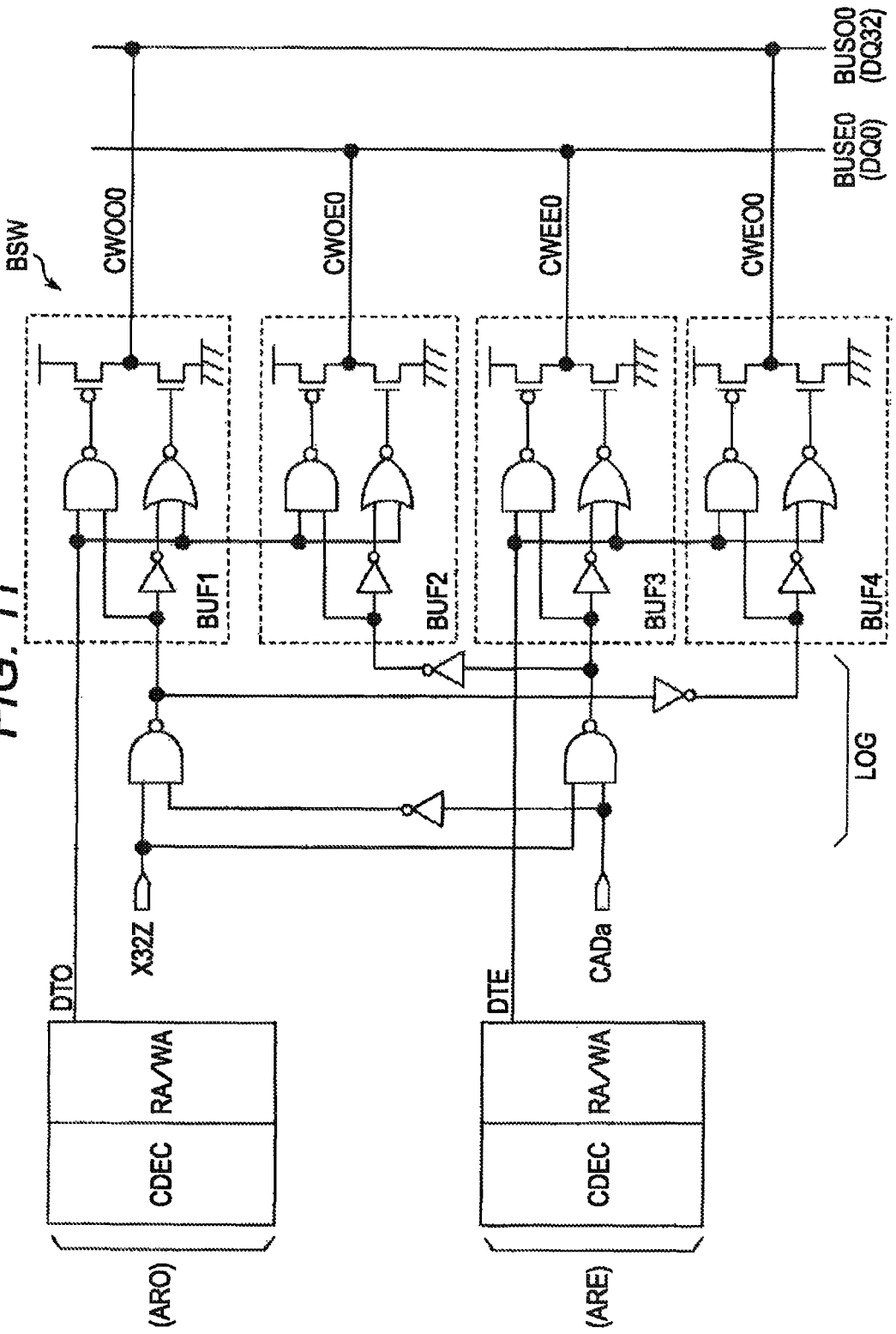
FIG. 11 illustrates another exemplary bus switch circuit.

FIG. 11 illustrates another exemplary bus switch circuit. In FIG. 11, substantially the same components as those of the previous embodiment are denoted by the same reference numerals and, therefore, the discussion thereof that follows is omitted or reduced. A construction excluding the bus switch circuit BSW may be substantially the same as that of the semiconductor memory MEM illustrated in FIG. 1 or 2. A semiconductor memory MEM may be a DRAM having 32-bit or 64-bit data terminals DQ. A bus switch circuit of FIG. 11 includes circuits corresponding to data terminals DQ 0 and DQ 32. Bus switch circuits BSW corresponding to the other data pads DQ may be substantially the same as or similar to the circuit illustrated in FIG. 11.

A logic circuit LOG for controlling operations of the read buffer circuits BUF 1-4 may be different from that illustrated in FIG. 9. A logic circuit LOG illustrated in FIG. 11 may not include a redundant logic illustrated in FIG. 9. Read buffer circuits BUF 1-4 may be substantially the same as or similar to the read buffer circuit illustrated in FIG. 9. Operations of the bus switch circuits BSW may be substantially the same as or similar to those illustrated in FIG. 10. The bus switch circuit illustrated in FIG. 11 also achieves substantially the same advantage as that of the previous embodiment.

Figure 12:
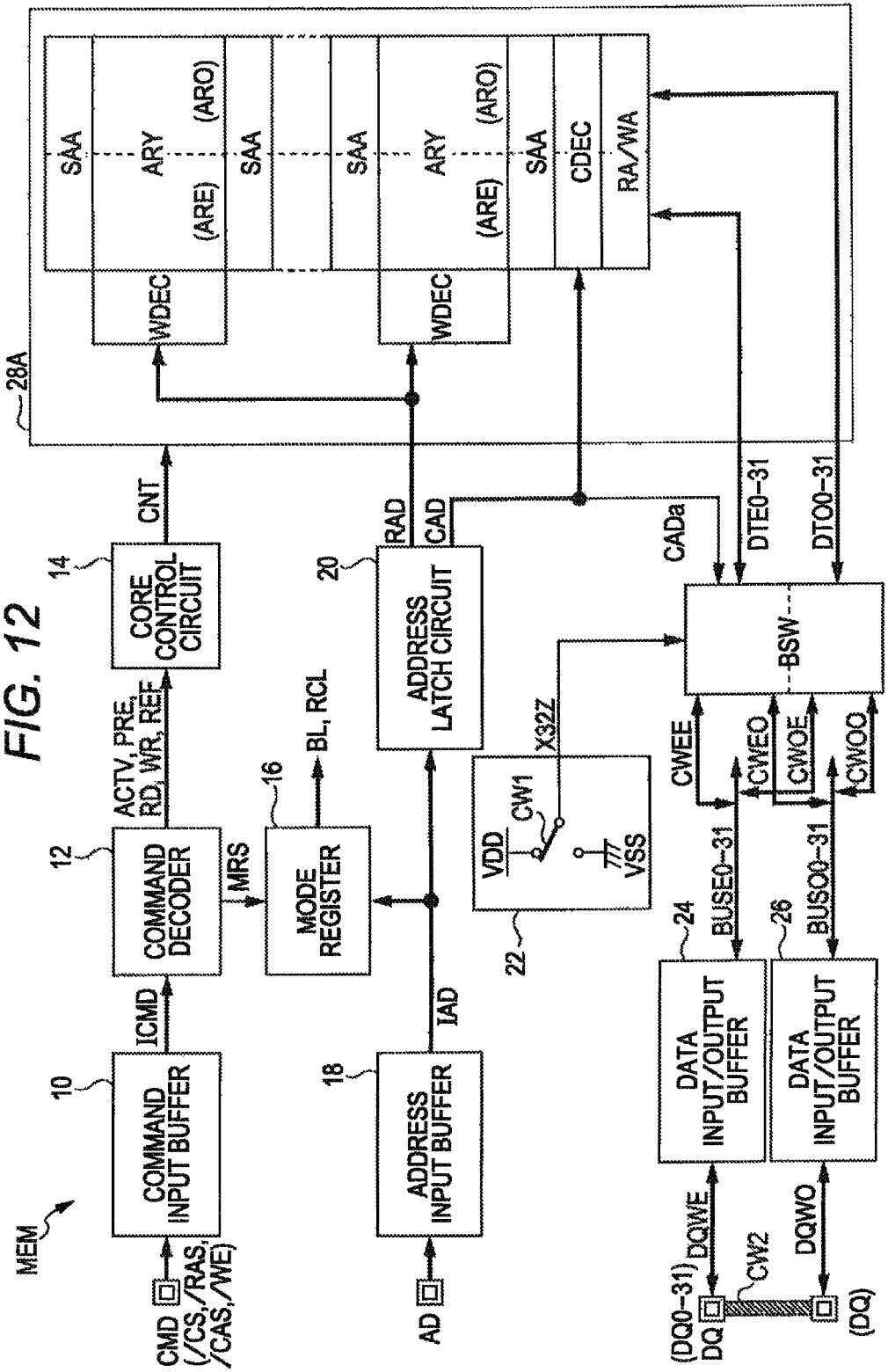
FIG. 12 illustrates a third embodiment.

FIG. 12 illustrates a third embodiment. In FIG. 12, substantially the same components as those of the previous embodiment are denoted by the same reference numerals and, therefore, the discussion thereof that follows is omitted or reduced. A memory core 28A illustrated in FIG. 12 may not, include a bus switch circuit BSW. A bus switch circuit BSW is interposed between the memory core 28A and data input/output buffers 24 and 26. The other construction illustrated in FIG. 12 may be substantially the same as or similar to that illustrated in FIG. 1. For example, a semiconductor memory MEM may be a DRAM having 32-bit or 64-bit data terminals DQ.

Connection wires CWEE (CWEE 0-31), CWOE (CWOE 0-31) are coupled to data buses BUSE (BUSE 0-31) likewise FIG. 1. Connection wires CEO (CEO 0-31), CWOO (CWOO 0-31) are coupled to data buses BUSO (BUSO 0-31). Since a bit width switch signal X32Z is set to a high level, the semiconductor memory MEM illustrated in FIG. 12 operates as a memory of a data signal DO having a bit width of 32 bits, for example, as a memory of a narrow bit mode NBM.

Figure 13:
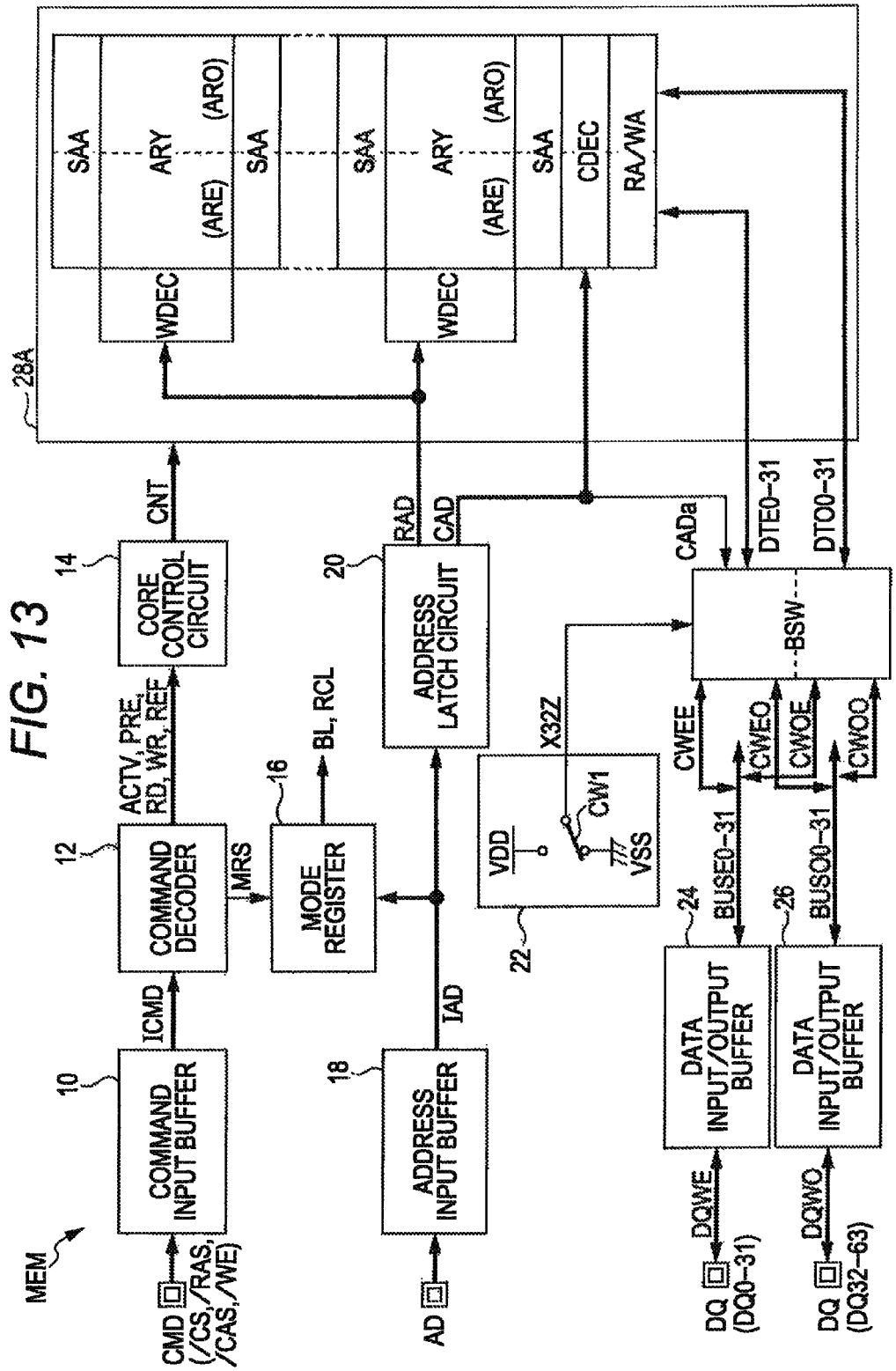
FIG. 13 illustrates a fourth embodiment.

FIG. 13 illustrates a fourth embodiment. In the fourth embodiment, a connection wire CW 1 is coupled to a ground line VSS, and a bit width switch signal X32Z is set to a low level. Since a semiconductor memory MEM illustrated in FIG. 13 may not include the connection wire CW 2 illustrated in FIG. 1, the bus width of a data signal of the semiconductor memory MEM is set to 64 bits, for example, to a wide bit mode WBM. A bus switch circuit BSW may be disposed in the vicinity of a write amplifier WA or a lead amplifier RA, and may be disposed in the vicinity of data input/output buffers 24 and 26. Since the bus switch circuit BSW is disposed in the vicinity of the data input/output buffers 24 and 26, charge/discharged currents of internal data lines DTE 0-31 and DTO 0-31 may be reduced. This is because that data is transmitted to one of the internal data lines DTE 0-31 and DTO 0-31 in a narrow bit mode NBM. Accordingly, when the lengths of the internal data lines DTE 0-31 and DTO 0-31 are relatively long compared with those of data buses BUSE 0-31 and BUSO 0-31, consumption of the current may be reduced.

Figure 14:
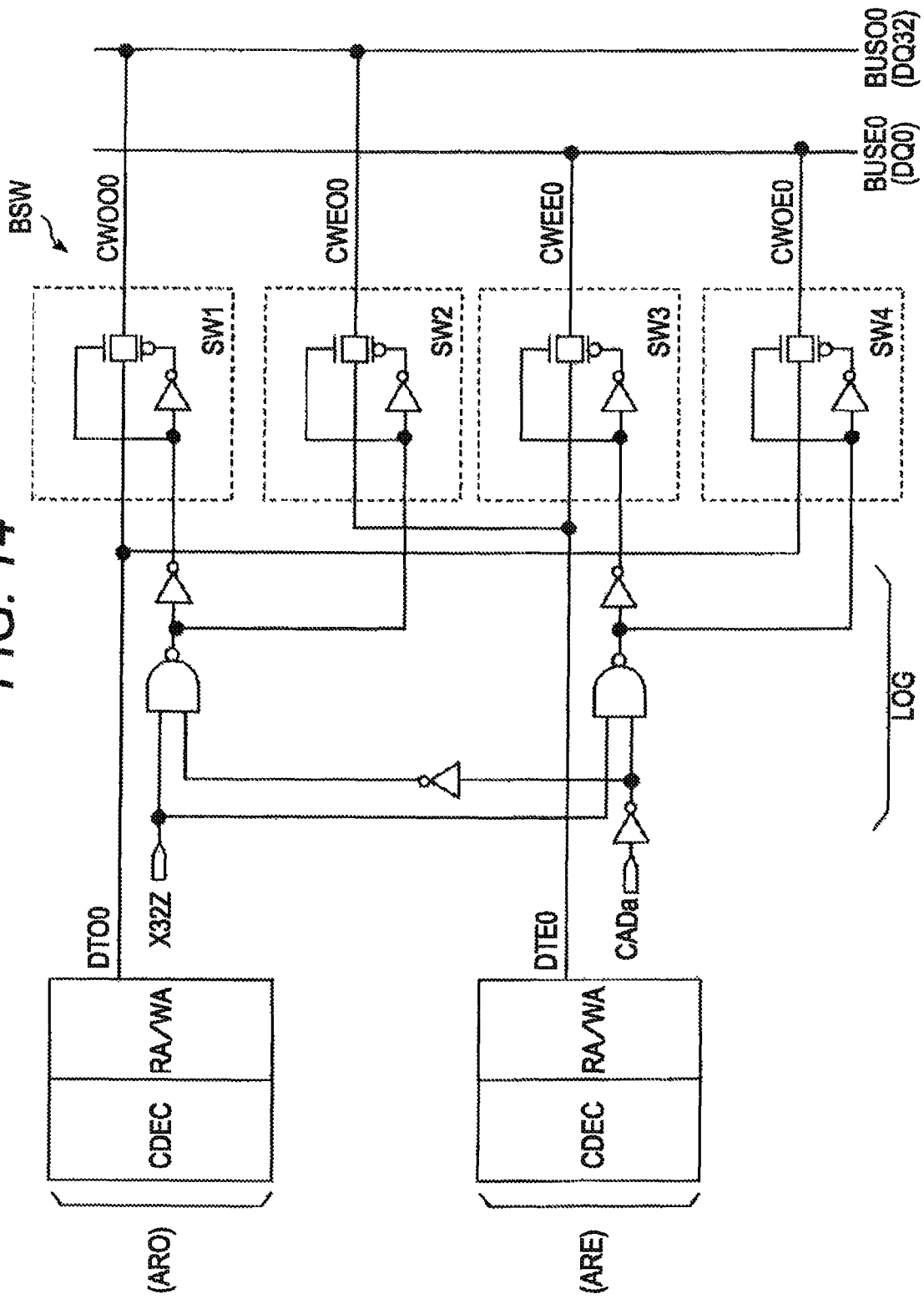
FIG. 14 illustrates an exemplary bus switch circuit.

FIG. 14 illustrates an exemplary bus switch circuit. The bus switch circuit illustrated in FIG. 14 may be the bus switch circuits BSW illustrated in FIGS. 12 and 13. The bus switch circuit illustrated in FIG. 14 includes circuits corresponding to data terminals DQ 0 and DQ 32. Bus switch circuits BSW corresponding to the other data pads DQ may be substantially the same as or similar to the bus switch circuit BSW illustrated in FIG. 14. The bus switch circuit BSW illustrated in FIG. 14 may include the circuit illustrated in FIG. 9 or 11.

The bus switch circuit BSW includes four bidirectional switches SW 1-4 and a logic circuit LOG for controlling an operation of the bidirectional switches SW 1-4. Each of the bidirectional switches SW 1-4 includes a CMOS transmission gate. Since the bus switch circuit BSW includes the bidirectional switches SW 1-4, read data and write data are transferred using the switches SW 1-4. Accordingly, a circuit of the bus switch circuit BSW may become small.

The switch SW 1 couples an internal data line DTO 0 to a connection wire CWOO 0. The switch SW 2 couples an internal data line DTE 0 to a connection wire CWEO 0. The switch SW 3 couples an internal data line DTE 0 to a connection wire CWEE 0. The switch SW 4 couples the internal data line DTO 0 to a connection wire CWOE 0.

The switch SW 1 turns on when a column address signal CADa is set to a high level in a narrow bit mode NBM. A data signal read from arrays ARO to the internal data line DTO 0 is output to a data bus BUSO 0 through the connection wire CWOO 0. The switch SW 2 turns on when the column address signal CADa is set to a low level in the narrow bit mode NBM or in a wide bit mode WBM. A data signal read from arrays ARE to the internal data line DTE 0 is output to the data bus BUSO 0 through the connection wire CWEO 0.

The switch SW 3 turns on when the column address signal CADa is set to the low level in the narrow bit mode NBM. A data signal read from the arrays ARE to the internal data line DTE 0 is output to a data bus BUSE 0 through the connection wire CWEE 0. The switch SW 4 turns on when the column address signal CADa is set to the high level in the narrow bit mode NBM or in the wide bit mode WBM. A data signal read from the arrays ARO to the internal data line DTO 0 is output to the data bus BUSE 0 through the connection wire CWOE 0.

FIG. 15 illustrates an exemplary operation of a bus switch circuit. The bus switch circuit whose operation is illustrated in FIG. 15 may be the bus switch circuit BSW illustrated in FIG. 14. Symbols ◯ in FIG. 15 indicate the switches SW 1-4 which turn on. Symbols X in FIG. 15 indicate the switches SW 1-4 which turn off.

When the bit width of a data signal. DQ is set to 32 bits (DQ 0-31), for example, to the narrow bit mode NBM, a pair of the switches SW 2 and SW 3 turn on or a pair of the switches SW 1 and SW 4 turn on in response to the column address signal CADa. When the bit width of the data signal DQ is set to 64 bits (DQ 0-63), for example, to the wide bit mode WBM, a pair of the switches SW 2 and SW 4 turn on and a pair of the switches SW 1 and SW 3 turn off. The relation between internal data lines DTE and DTO to be coupled and data buses BUSE and BUSO may be substantially the same as or similar to the relation illustrated in FIG. 10.

The fourth embodiment achieves substantially the same effect as those of the previous embodiment.

Figure 16:
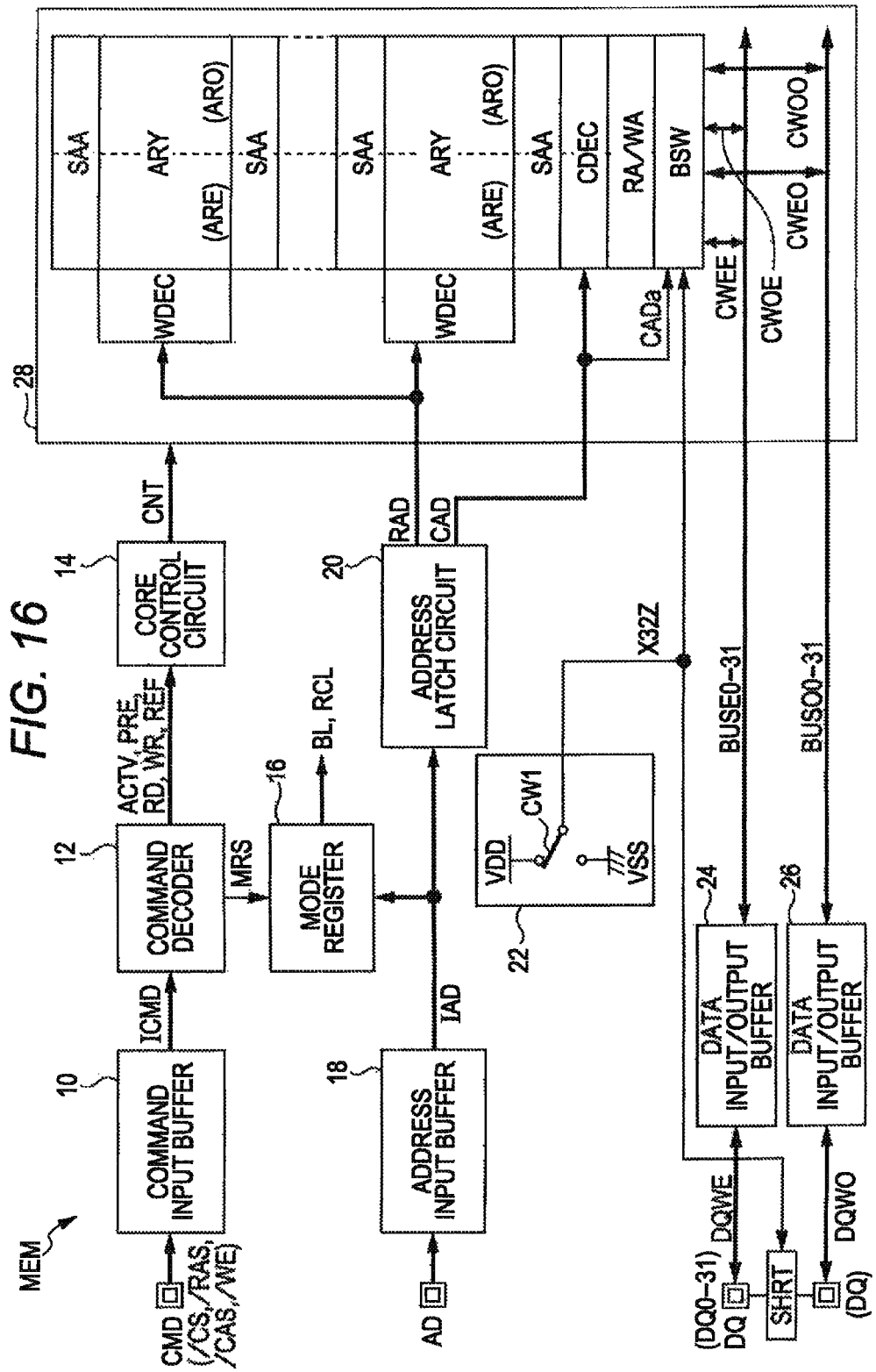
FIG. 16 illustrates a fifth embodiment.

FIG. 16 illustrates a fifth embodiment. In FIG. 16, substantially the same components as those of the previous embodiment are denoted by the same reference numerals and, therefore, the discussion thereof that follows is omitted or reduced. A semiconductor memory illustrated in FIG. 16 may include a short circuit SHRT for coupling pairs of data pads DQ, for example, DQ 0 and DQ 32 with each other in place of the connection wire CW 2 illustrated in FIG. 1. The other construction is substantially the same as or similar to that of FIG. 1. Since a connection wire CW 1 of a bit width switch circuit 22 is coupled to a power supply line VDD, a semiconductor memory MEM illustrated in FIG. 16 includes 32-bit data terminals DQ. When the semiconductor memory MEM includes 64-bit data terminals DQ, the connection wire CW 1 is coupled to a ground line VSS. The semiconductor memory MEM may be, for example, a DRAM. A bus switch circuit BSW of FIG. 16 may include the circuit illustrated in FIG. 11 or 14.

Figure 17:
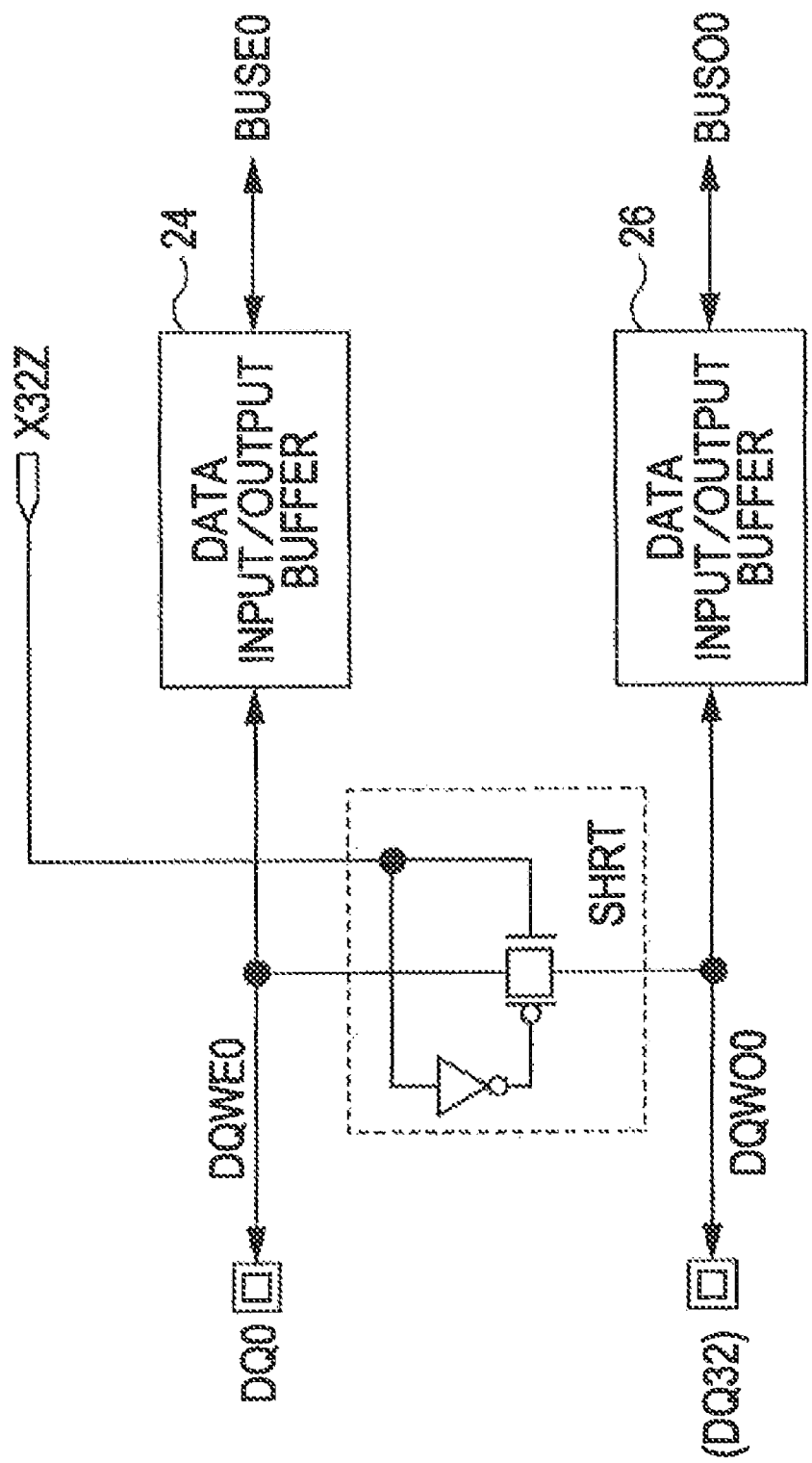
FIG. 17 illustrates an exemplary short circuit.

FIG. 17 illustrates an exemplary short circuit. The short circuit illustrated in FIG. 17 may be the short circuit SHRT illustrated in FIG. 16. The short circuit illustrated in FIG. 17 includes a circuit corresponding to data pads DQ 0 and DQ 32. Short, circuits SHRT corresponding to the other data pads DQ may also include the circuit illustrated in FIG. 17. For example, a data pad DQ 1 and a data pad DQ 33 are coupled to each other, a data pad DQ 2 and a data pad DQ 34 are coupled to each other, and a data pad DQ 31 and a data pad DQ 63 are coupled to each other by different short circuits SHRT. A device for preventing electrostatic breakdown may be inserted between the data pads DQ 0 and DQ 32 and the short circuit SHRT.

For example, the short circuit SHRT includes a CMOS transmission gate for coupling the data pad DQ 0, for example, a data wire DQWE and the data pad DQ 32, for example, a data wire DQWO with each other. The short circuit SHRT turns on when a bit width switch signal X32Z is set to a high level, and turns off when the bit width switch signal X32Z is set to a low level.

The fifth embodiment achieves substantially the same effect as those of the previous embodiment. Since the short circuit SHRT couples a pair of the data pads DQ with each other, the semiconductor memory MEM may be switched to a 32-bit memory or to a 64-bit memory after the semiconductor memory MEM is manufactured. For example, since a bit width switch circuit 22 includes a fuse circuit, the bit width of data may be switched at a test process of the semiconductor memory MEM. The bit width switch circuit 22 includes a transistor which turns on and off by a value of a mode register 16. The bit width of the data may be switched after the semiconductor memory MEM is mounted on a system SYS. The bit width may be switched by setting the mode register 16 during a power-on sequence of the system SYS.

Figure 18:
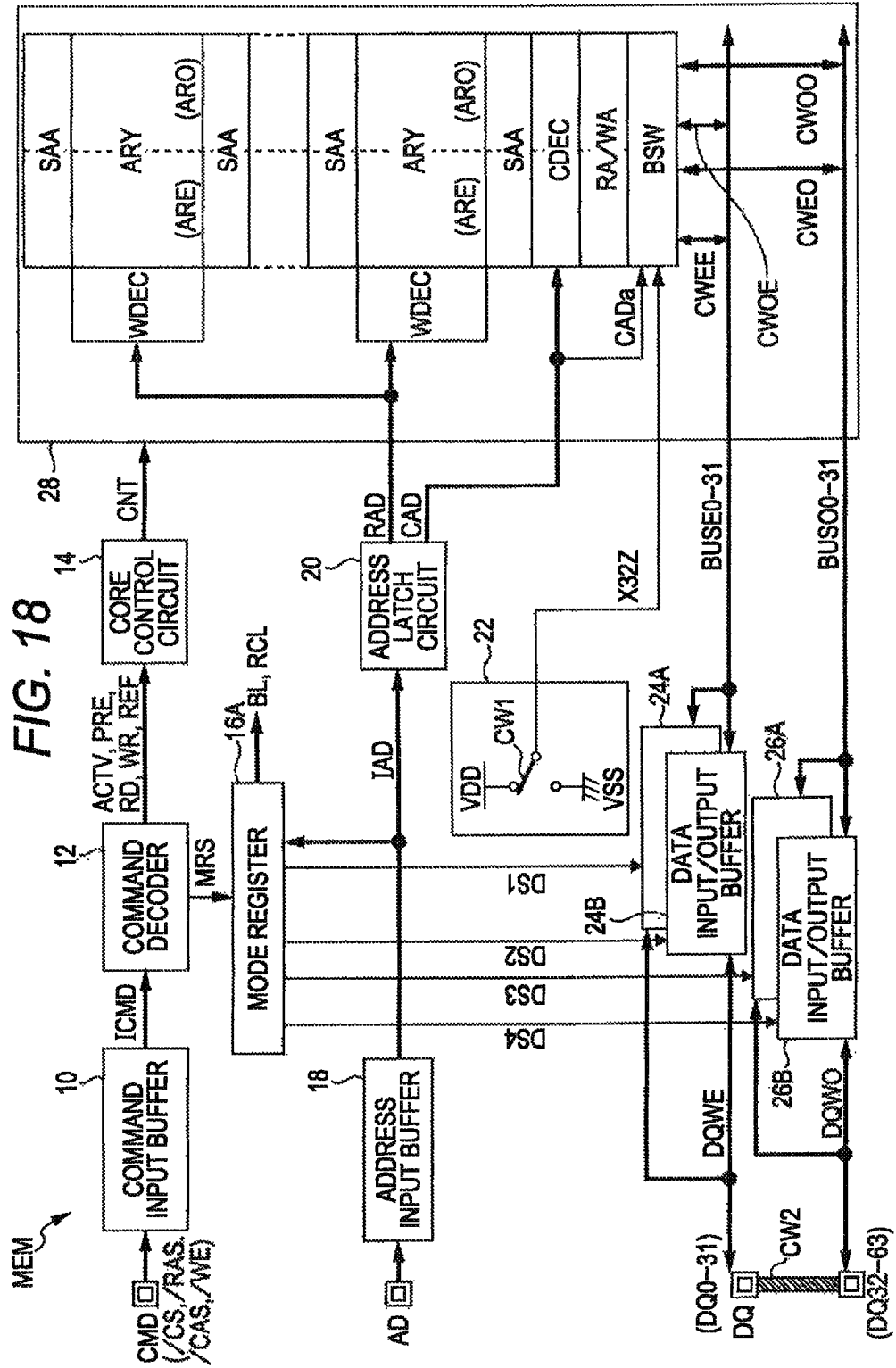
FIG. 18 illustrates a sixth embodiment.

FIG. 18 illustrates a sixth embodiment. In FIG. 18, substantially the same components as those of the previous embodiment are denoted by the same reference numerals and, therefore, the discussion thereof that follows is omitted or reduced. A semiconductor memory MEM includes a plurality of the data input/output buffers 24A and 24B or data input/output buffers 26A and 26B in each of data pads DQ. A mode register 16A includes a plurality of selection registers for outputting selection signals DS 1-4 to activate or deactivate the data input/output buffers 24A, 24B, 26A, and 26B. The other construction is substantially the same as or similar to that of FIG. 1. Since a connection wire CW 1 of a bit width switch circuit 22 is coupled to a power supply line VDD, the semiconductor memory MEM illustrated in FIG. 18 includes 32-bit data terminals DQ. When the connection wire CW 1 is coupled to a ground line VSE, the semiconductor memory MEM includes 64-bit data terminals DQ. The semiconductor memory MEM may be, for example, a DRAM. A bus switch circuit BSW of FIG. 18 may include the circuit illustrated in FIG. 11 or 14.

A selection register of a mode register 16A is set according to an address signal IAD(AD) received together with a mode register setting command signal MRS. The selection register outputs selection signals DS 1-4 having a logic level corresponding to a set value.

Figure 19:
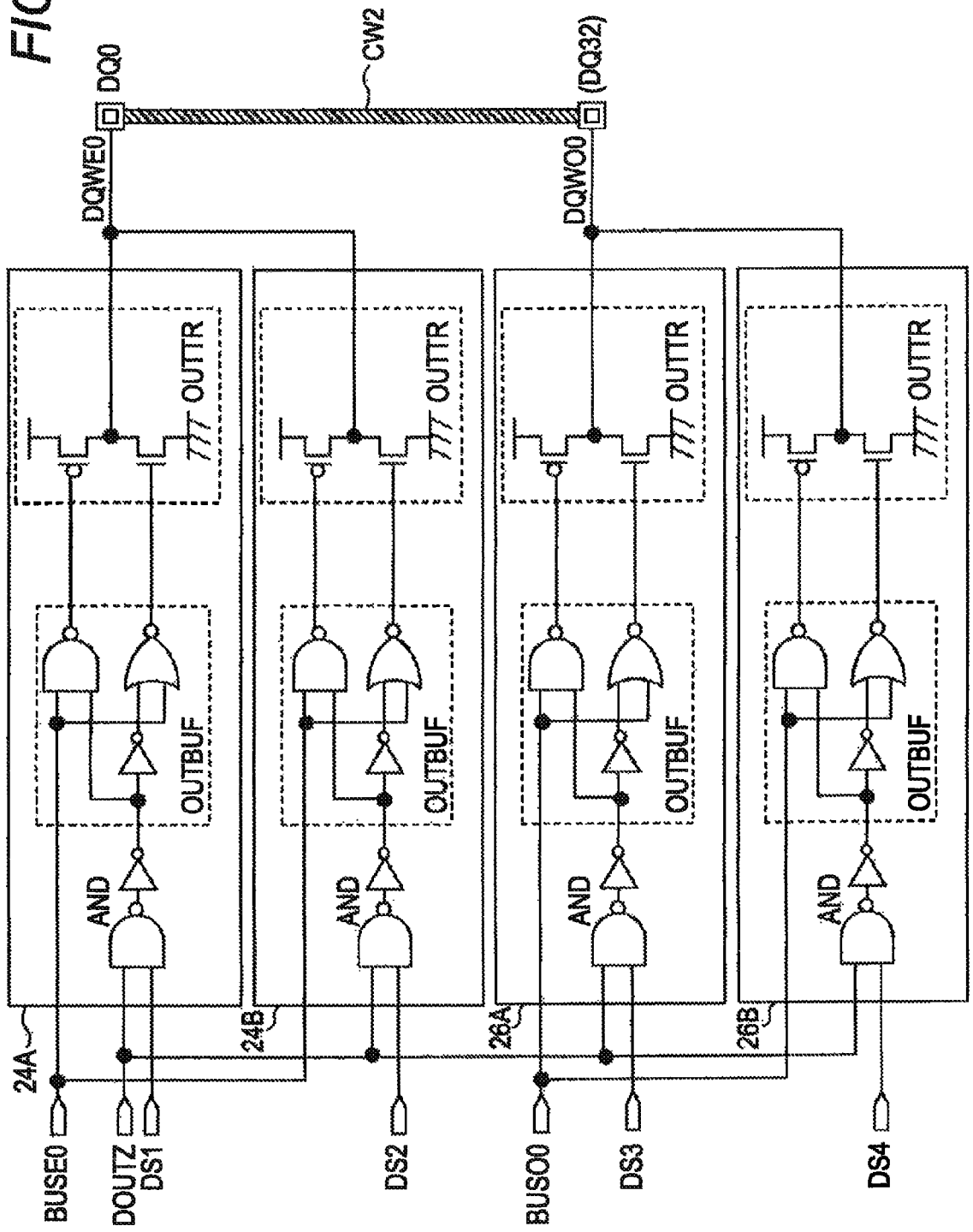
FIG. 19 illustrates an exemplary data input/output buffer.

FIG. 19 illustrates an exemplary data input/output buffer. The data input/output buffer illustrated in FIG. 19 may be the data input/output buffers 24A, 24B, 26A, and 265 illustrated in FIG. 18. The data input/output buffer illustrated in FIG. 19 includes a circuit corresponding to data terminals DQ 0 and DQ 32. Data input/output buffers 24A, 24B, 26A, and 265 corresponding to the other data pads DQ may be also substantially the same as or similar to the data input/output buffer illustrated in FIG. 19.

The drive capabilities of data output circuits OUTTR of the respective data input/output buffers 24A, 24B, 26A, and 26B are different from those of the data input/output buffers 24 and 26 illustrated in FIG. 6. Inputs of output buffers OUTBUF of the respective data input/output buffers 24A, 24B, 26A, and 26B are coupled to AND circuits. The other construction may be substantially the same or similar to the construction of the data input/output buffers 24 and 26 illustrated in FIG. 6. In FIG. 19, description of input buffers INBUF may be omitted.

For example, the drive capabilities of the data output circuits OUTTR of the respective data input/output buffers 24A, 24B, 26A, and 26B may be one half those of the data output circuits OUTTR of the data input/output buffers 24 and 26 illustrated in FIG. 6. The data input/output, buffer 24A operates when the selection signal DS 1 is set to a high level. The data input/output buffers 24B, 26A, and 26B operates when the selection signals DS 2-4 are set to the high level.

FIG. 20 illustrates an exemplary operation of the data input/output buffers. The data input/output buffers illustrated in FIG. 20 may be the data input/output buffers 24A, 24B, 26A, and 26B illustrated in FIG. 19. In a narrow bit mode NBM, the drive capabilities DRV of the data output circuits OUTTR are set to one of four types according to the number of the selection signals DS 1-4 set to the high level. The drive capabilities DRV of the data output circuits OUTTR per data pad DQ are set to one of "1," "2," "3," "4." In FIG. 20, the drive capability DRV of one data output circuit OUTTR is set to, for example, "1."

In a wide bit mode WBM, the selection signals DS 1 and DS 3 are set to the high level. When the selection signals DS 2 and DS 4 are set to the high level, two data output circuits OUTTR operate per data pad DQ, and the drive capabilities thereof DRV are set to "2." When the selection signals DS 2 and DS 4 are set to a low level, the data input/output buffers 24A and 26A operate, and the data input/output buffers 24B and 26B may not operate. Accordingly, the drive capabilities DRV of the data output circuits OUTTR per data pad DQ is set to "1".

The sixth embodiment achieves substantially the same effect as those of the previous embodiment. Since the plurality of data input/output buffers 24A and 24B for the input/output buffers 26A and 26B) are formed to each data pad DQ, the drive capabilities of the data output circuits OUTTR are optimally set according to a specification of a system SYS. For example, in the narrow bit mode NBM, the number of the data output circuits OUTTR which operate are set according to the number of loads coupled to the memory bus MBUS illustrated in FIG. 3, for example, according to the number of the semiconductor memories MEM. In the wide bit mode WBM, the number of the data output circuits OUTTR which operate are set according to loads of the data buses DQ 0-63 illustrated in, for example, FIG. 4.

Figure 21:
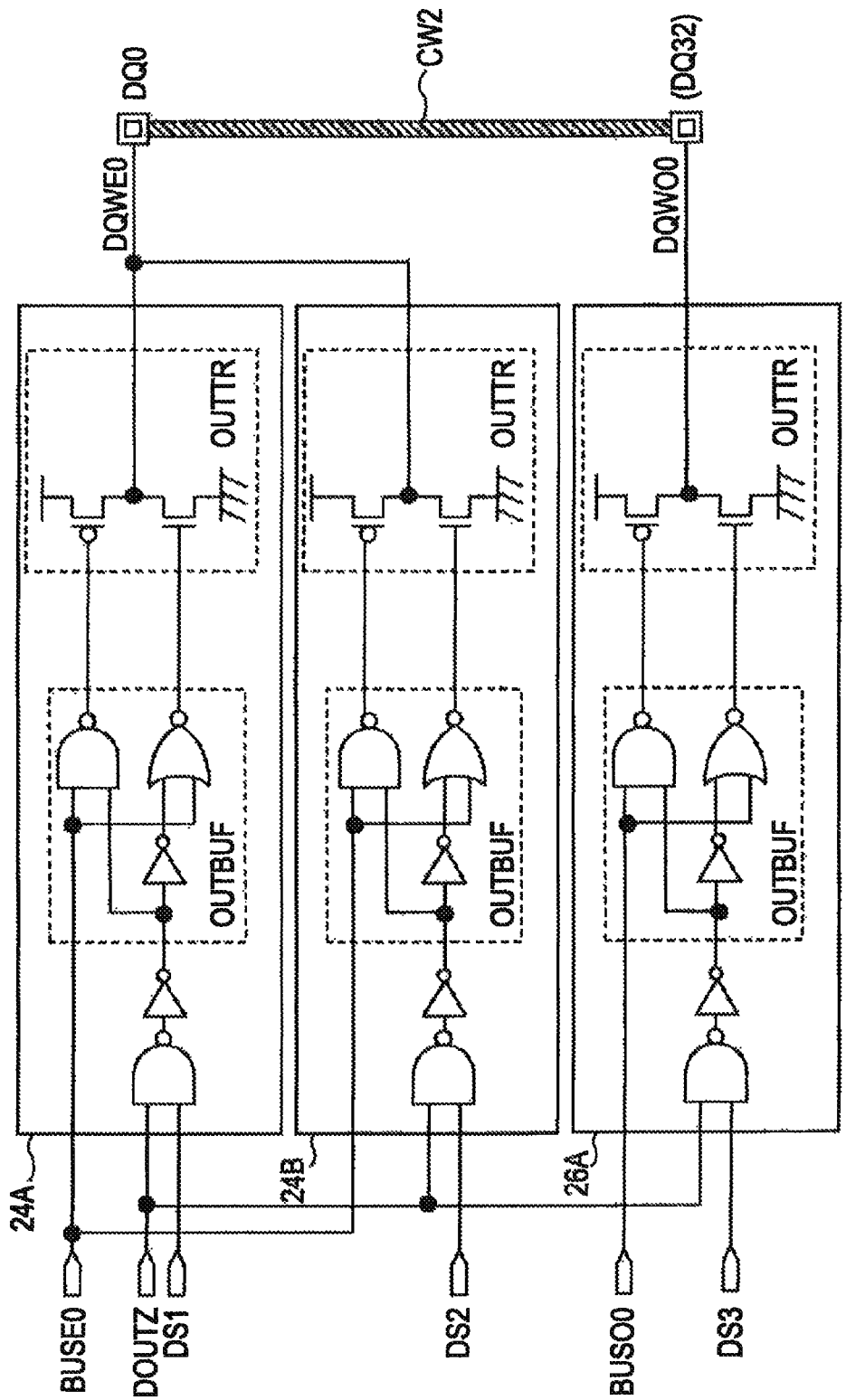
FIG. 21 illustrates a seventh embodiment.

FIG. 21 illustrates a seventh embodiment. A semiconductor memory MEM illustrated in FIG. 21 includes data input/output buffers 24A, 24B, and 26A. In FIG. 21, substantially the same components as those of the previous embodiment are denoted by the same reference numerals and, therefore, the discussion thereof that follows is omitted or reduced. The semiconductor memory MEM illustrated in FIG. 21 may not include the data input/output buffer 26B and a selection signal line DS 4 illustrated in FIG. 18. The other construction is substantially the same as or similar to that illustrated in FIGS. 18 and 19, A bus switch circuit BSW may include the circuit illustrated in FIG. 11 or 14. Description of input buffers INBUF is omitted. For example, the semiconductor memory MEM may be a DRAM having 32-bit or 64-bit data terminals DQ. The semiconductor memory illustrated in FIG. 21 includes circuits corresponding to data terminals DQ 0 and DQ 32. Data input/output buffers 24A, 243, and 26A corresponding to the other data pads DQ may be also substantially the same as or similar to the data input/output buffers illustrated in FIG. 21.

FIG. 22 illustrates an exemplary operation of the data input/output buffers. The data input/output buffers illustrated in FIG. 22 may be the data input/output buffers 24A, 24B, and 26A illustrated in FIG. 21. In FIG. 22, a drive capability DRV of one data output circuit OUTTR is set to "1" likewise FIG. 20.

In a narrow bit mode NBM, drive capabilities DRV of data output circuits OUTTR are set to one of three types according to the number of selection signals DS 1-3 set to a high level. The drive capabilities DRV of the data output circuits OUTTR per data pad DQ are set to one of "1," "2," or "3." In a wide bit mode WBM, the selection signals DS 1 and DS 3 are set to a high level. The selection signals DS 2 is set to a low level. Accordingly, the drive capabilities DRV of the data output circuits OUTTR per data pad DQ is set to "1," The seventh embodiment achieves substantially the same effect as those of the previous embodiment.

Figure 23:
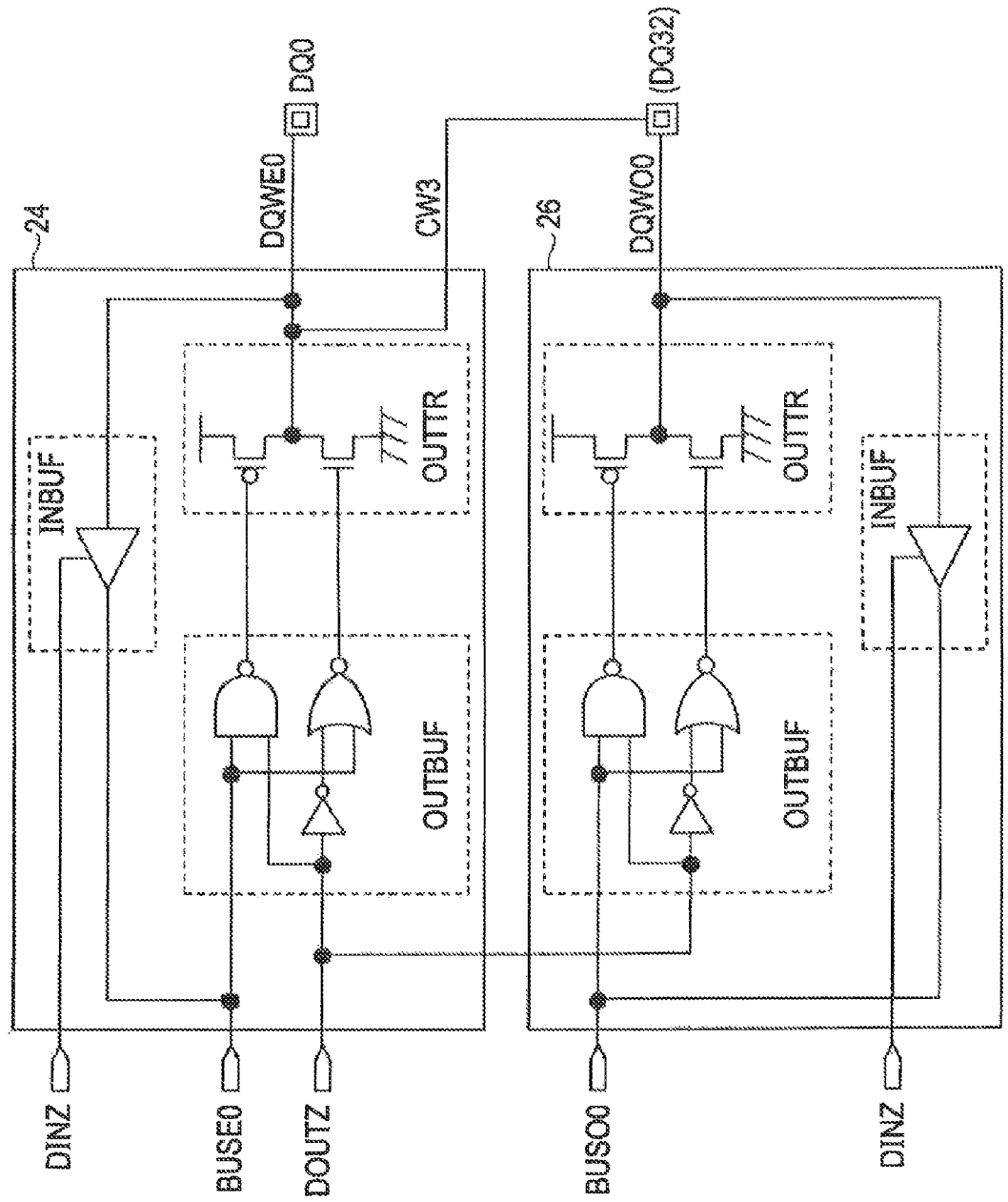
FIG. 23 illustrates an eighth embodiment.

FIG. 23 illustrates an eighth embodiment. A semiconductor memory MEM illustrated in FIG. 23 includes data input/output buffers 24 and 26. In FIG. 23, substantially the same components as those of the previous embodiment are denoted by the same reference numerals and, therefore, the discussion thereof that follows is omitted or reduced. The semiconductor memory MEM illustrated in FIG. 23 includes circuits corresponding to data terminals DQ 0 and DQ 32. Data input/output buffers 24 and 26 corresponding to the other data pads DQ may be also substantially the same as or similar to the data input/output buffers illustrated in FIG. 23. A bus switch circuit BSW may include the circuit illustrated in FIG. 11 or 14.

The semiconductor memory MEM may include a connection wire CW 3 for coupling data wires DQNE to the data pad DQ 32 in place of the connection wire CW 2 illustrated in FIG. 1. The other construction of the semiconductor memory MEM is substantially the same as or similar to that of FIG. 1. Data wires DQWO may be coupled to the data pad DQ 0 through the connection wire CW 3. Data wires DQWE 0 and DQWO 0 may be coupled to each other through the connection wire CW 3.

In the semiconductor memory MEM of the eighth embodiment, data terminals DQ are set to 32 bits, for example, to a narrow bit mode NBM by the connection wire CW 3. In the semiconductor memory MEM, the data terminals DQ are set to 64 bits, for example, to a wide bit mode WBM as illustrated in FIG. 2 by providing no connection wire CW 3. The connection wire CW 3 may be formed on an upper layer of the semiconductor memory MEM likewise the connection wire CW 1.

Figure 24:
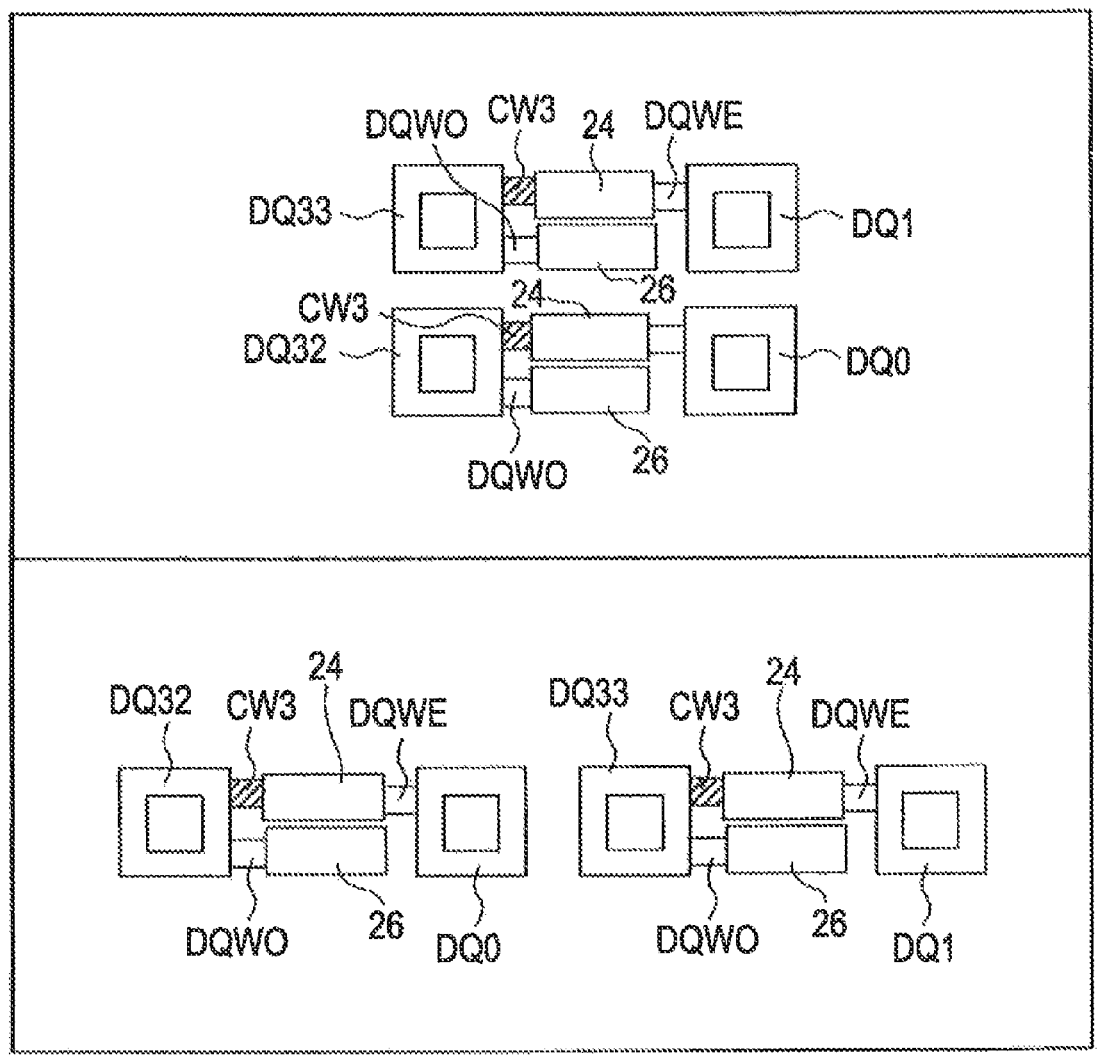
FIG. 24 illustrates an exemplary layout of a data input/output buffer.

FIG. 24 illustrates an exemplary layout of the data input/output buffer. The data input/output buffer illustrated in FIG. 24 may be the data input/output buffers 24 and 26 illustrated in FIG. 23. For example, the connection wire CW 3 couples the data input/output buffer 24 to the data pad DQ 32 or to a data pad DQ 33. The illustrated example indicates an example where the data pads DQ are formed inside of a chip of the semiconductor memory MEM. The eighth embodiment achieves substantially the same effect as those of the embodiment described above.

Figure 25:
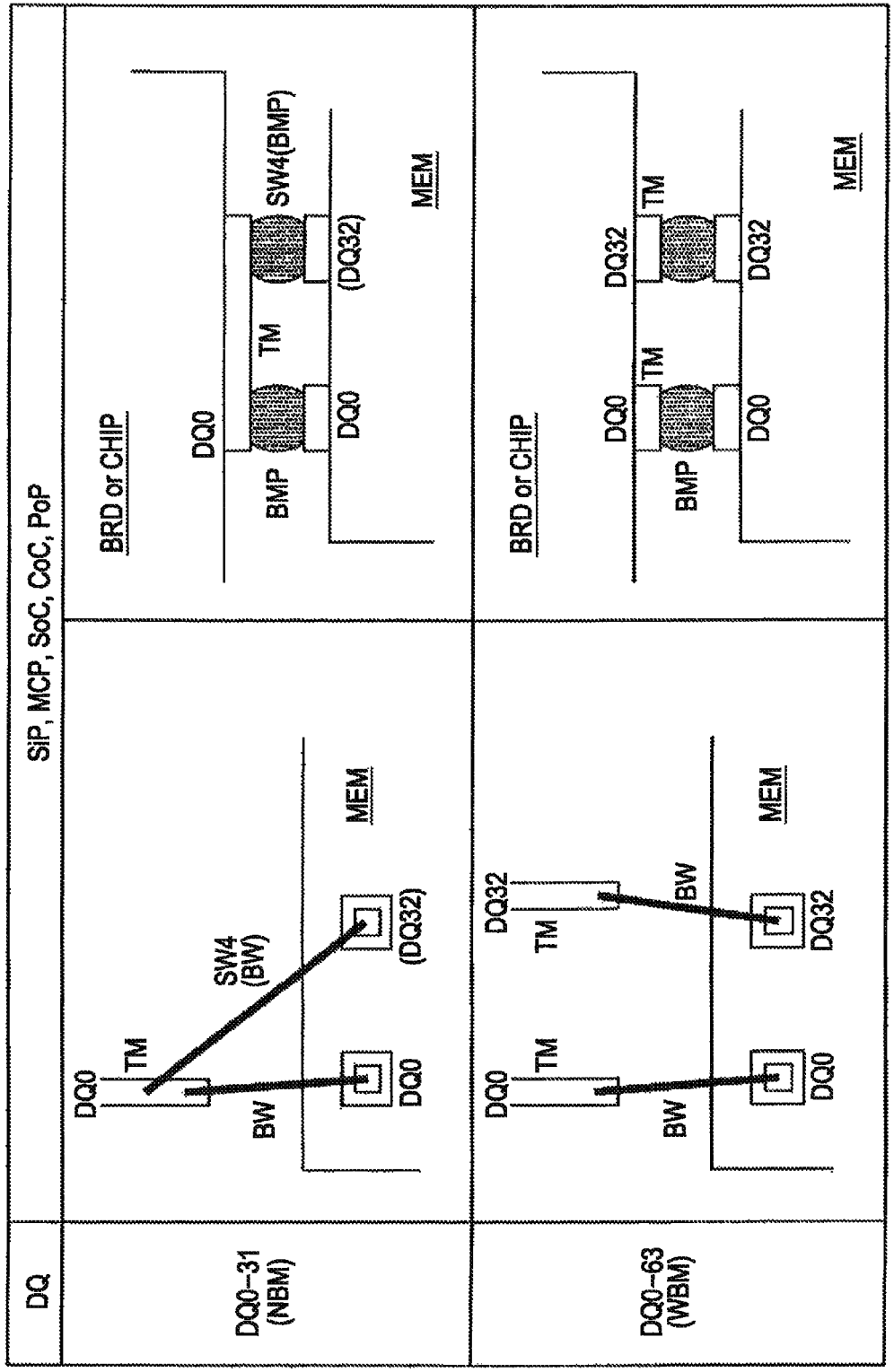
FIG. 25 illustrates an exemplary data pad connection.

FIG. 25 illustrates an exemplary data pad connection. Substantially the same components as those of the previous embodiment are denoted by the same reference numerals and, therefore, the discussion thereof that follows is omitted or reduced. For example, the semiconductor memory MEM may be a DRAM having 32-bit or 64-bit data terminals DQ.

In FIG. 25, a connection wire CW 4 is formed of a bonding wire BW or a bump BMP in place of the connection wire CW 2 illustrated in FIG. 1. The data pad DQ 0 and the data pad DQ 32 are coupled to each other by the bonding wire BW or the bump BMP. The connection wire CW 4 includes a metal material. The other construction of the semiconductor memory MEM is substantially the same as or similar to that illustrated in FIG. 1.

A bit width switch circuit 22 may include a transistor which is controlled by a value of a fuse circuit or a mode register 16. The fuse circuit is programmed at a test process of the semiconductor memory MEM. The mode register 16 is switched by setting the mode register 16 during a power-on sequence of a system SYS. When the bump BMP is used in a narrow bit mode NBM, a terminal TM on a substrate BRD or on a different semiconductor chip CHIP is commonly formed to two bumps BMP. The other construction is substantially the same as or similar to that illustrated in FIG. 5.

The connection wire CW 4 may be used in place of the short circuit SHRT illustrated in FIG. 16 or the connection wire CW 3 illustrated in FIG. 23. The semiconductor memory MEM may be mounted on a single package. When the semiconductor memory MEM is mounted on the single package, the bonding wire EN may be coupled to a lead of a lead frame.

The eighth embodiment achieves substantially the same effect as that of the embodiment described above. Since the bonding wire BW or the bump BMP is used as the connection wire CW 4, the connection wire CW 2 and the like for coupling between the data pads DQ may be not necessary. Accordingly, the semiconductor memory MEM is switched to a 32-bit memory or to a 64-bit memory in an assembly process after the semiconductor memory MEM is manufactured.

The previous embodiments are applied to a DRAM. However, the previous embodiment may be applied to other semiconductor memories such as a pseudo SRAM, an SRAM, a ferroelectric memory, a flash memory.

The previous embodiments are applied to a semiconductor memory the bus width of the data signals DQ of which are set to one of 32 bits and 64 bits. However, the previous embodiment may be applied to, for example, a semiconductor memory set to another bit width.

Example embodiments of the present invention have now been described in accordance with the above advantages. It will be appreciated that these examples are merely illustrative of the invention. Many variations and modifications will be apparent to those skilled in the art.

Moreover, the term "or" is intended to mean an inclusive "or" rather than an exclusive "or." That is, unless specified otherwise, or clear from the context, the phrase "X employs A or B" is intended to mean any of the natural inclusive permutations. That is, the phrase "X employs A or B" is satisfied by any of the following instances X employs A; X employs B; or X employs both A and B. In addition, the articles "a" and "an" as used in this application and the appended claims should generally be construed to mean "one or more" unless specified otherwise or clear from the context to be directed to a singular form.

What is claimed is:

1. A semiconductor memory, comprising:
    a first output buffer corresponding to a first pad;
    a second output buffer corresponding to a second pad; and
    a switch circuit that performs one selected function from a group consisting of supplying first data from a first data line to the first output buffer and the second output buffer and supplying second data from a second data line which is different from the first data line to the second output buffer while supplying the first data to the first output buffer.

2. The semiconductor memory according to claim 1, wherein the switch circuit is supplied with information indicating a bus width of the memory.

3. The semiconductor memory according to claim 1, further comprising a bus having an n-bit width for outputting data, wherein n is a positive integer, and a total number of the first pad and the second pad is 2n.

4. The semiconductor memory according to claim 2, wherein the number of the first pad is n and the number of the second pad is n.

5. The semiconductor memory according to claim 1, further comprising:
    a first circuit including a first column decoder; and
    a second circuit including a second column decoder,
    wherein the switch circuit is included to the first circuit and the second circuit.

6. The semiconductor memory according to claim 5, further comprising:
    a first signal line coupled to the first output buffer;
    a second signal line coupled to the second output buffer;
    a third signal line coupled to the first circuit and the first signal line;
    a fourth signal line coupled to the first circuit and the second signal line;
    a fifth signal line coupled to the second circuit and the first signal line; and
    a sixth signal line coupled to the second circuit and the second signal line.

7. The semiconductor memory according to claim 1, further comprising:
    a first circuit including a first column decoder;
    a second circuit including a first column decoder;
    a first signal line coupled to the first output buffer;

a second signal line coupled to the second output buffer;
a third signal line coupled to the first circuit; and
a fourth signal line coupled to the second circuit,
wherein the switch circuit comprises:
a first switch circuit that selectively couples one of the third signal line and the fourth signal line to the first signal line; and
a second switch circuit that selectively couples one of the third signal line and the fourth signal line to the second signal line.

* * * * *